(12) United States Patent
Kuwajima et al.

(10) Patent No.: US 7,859,080 B2
(45) Date of Patent: Dec. 28, 2010

(54) ELECTRONIC COMPONENT COMPRISING A COIL CONDUCTOR AND A CAPACITY ELEMENT

(75) Inventors: Hajime Kuwajima, Tokyo (JP); Akira Furuya, Tokyo (JP); Masahiro Miyazaki, Tokyo (JP); Makoto Shibata, Tokyo (JP)

(73) Assignee: TDK Corporation, Tokyo (JP)

( * ) Notice: Subject to any disclaimer, the term of this patent is extended or adjusted under 35 U.S.C. 154(b) by 279 days.

(21) Appl. No.: 11/606,931

(22) Filed: Dec. 1, 2006

(65) Prior Publication Data

US 2007/0132060 A1 Jun. 14, 2007

(30) Foreign Application Priority Data

Dec. 14, 2005 (JP) ............................. 2005-359960

(51) Int. Cl.
  *H01L 27/08* (2006.01)
(52) U.S. Cl. .................. 257/531; 257/532; 257/533; 257/535; 257/528; 257/508; 257/275; 257/277; 257/307; 257/E21.022; 257/E29.343; 257/E23.144; 361/311; 361/821; 336/200; 438/239
(58) Field of Classification Search ................ 257/531, 257/535, 532, 277, 275, E21.022, 528, 508, 257/533, E29.343, E23.144; 361/311, 821; 438/239; 336/200
See application file for complete search history.

(56) References Cited

U.S. PATENT DOCUMENTS

| | | | |
|---|---|---|---|
| 6,166,424 A | 12/2000 | Mikawa et al. | |
| 6,255,714 B1 * | 7/2001 | Kossives et al. | 257/528 |
| 6,271,082 B1 * | 8/2001 | Hou et al. | 438/250 |
| 6,552,384 B2 | 4/2003 | Murata et al. | |
| 6,562,677 B1 | 5/2003 | Mikawa et al. | |
| 6,806,553 B2 | 10/2004 | Yashima et al. | |
| 6,818,498 B2 | 11/2004 | Mikawa et al. | |
| 2002/0117685 A1 * | 8/2002 | Mochizuki et al. | 257/198 |
| 2002/0153616 A1 * | 10/2002 | Kunihisa et al. | 257/778 |
| 2003/0052077 A1 * | 3/2003 | Hanhikorpi | 216/2 |

FOREIGN PATENT DOCUMENTS

| | | |
|---|---|---|
| JP | A-9-51203 | 2/1997 |
| JP | 3193973 B2 | 6/2001 |
| JP | 2002-025854 | 1/2002 |
| JP | 2002-033559 | 1/2002 |
| JP | 2003-017366 | 1/2003 |
| JP | A-2003-45742 | 2/2003 |
| JP | A-2004-342929 | 12/2004 |

OTHER PUBLICATIONS

Siliconfareast.com document for conventional dielectric rates.*

* cited by examiner

*Primary Examiner*—Matthew E Warren
*Assistant Examiner*—David Z Chen
(74) *Attorney, Agent, or Firm*—Oliff & Berridge, PLC

(57) ABSTRACT

The invention provides an electronic component which has an improved breakdown limit value of withstand voltage and improved insulation properties and which can be made compact and provided with a multiplicity of layers and a great capacity. The electronic component includes a first conductor having a bottom conductor formed on a substrate and a raised conductor formed to protrude from the bottom conductor, a dielectric film formed on the raised conductor, and a second conductor formed on the dielectric film to constitute a capacitor element in combination with the raised conductor and the dielectric film.

11 Claims, 20 Drawing Sheets

ELECTRONIC COMPONENT COMPRISING A COIL CONDUCTOR AND A CAPACITY ELEMENT

BACKGROUND OF THE INVENTION

1. Field of the Invention

The present invention relates to an electronic component having a capacitor element.

2. Description of the Related Art

Various types of surface-mount electronic components are mounted on a circuit inside an electronic apparatus such as a personal computer or portable telephone. Known surface-mount electronic components include thin-film type electronic components formed using thin film forming techniques.

Thin-film electronic components include thin-film capacitors, thin-film inductors, thin-film LC composite components, and thin-film multi-layer components. Composite components having a capacitor include low-pass filters (LPFs), high-pass filters (HPFs), band-pass filters (BPFs), and trap filters which eliminate signals in a predetermined frequency range. Further, those components may be combined to provide electronic components such as diplexers, duplexers, antenna switch modules, and RF modules.

There is demand for compactness and reductions in the height and cost of electronic components to be used at frequencies as high as 500 MHz or more and, more particularly, at frequencies in a micro-wave frequency band (GHz band). In the case of capacitors to be used at high frequencies, compactness and greater capacities have been pursued by employing a dielectric film made of a material having a high dielectric constant or reducing the thickness of a dielectric film. Further efforts toward capacitors having greater capacities include the use of multi-layer dielectric films and increasing the area of capacitor electrodes.

However, the use of a dielectric film made of a material having a great dielectric constant results in an increase in a dielectric loss tangent, which consequently results in an increase in transmission loss of a capacitor in the operational frequency range thereof. Under the circumstance, a dielectric film made of a material resulting in a small dielectric loss tangent is used for a capacitor to be used at a high frequency.

FIGS. 20A and 20B show a schematic configuration of a thin-film type capacitor element 411 according to the related art. FIG. 20A is a plan view of the capacitor element 411, and FIG. 20B is a sectional view of the same taken along the line A-A in FIG. 20A. As shown in FIGS. 20A and 20B, the capacitor element 411 includes a bottom conductor 421 formed on a substrate 51, a dielectric film 431 formed on the bottom conductor 421, and a top conductor 423 formed on the dielectric film 431. Part of the bottom conductor 421 and the top conductor 423 serves as an electrode of the capacitor element 411. An area l1×l2 which is the area of the dielectric film sandwiched between the bottom conductor 421 and the top conductor 423 is defined as the area of the electrode that is one factor determining the capacity value of the capacitor element 411.

In the capacitor element 411 according to the related art, the dielectric film 431 tends to be smaller in thickness at edges of the bottom conductor 421 than on a top surface thereof. When the thickness of the dielectric film 431 is reduced, the dielectric film 431 may not be formed on the bottom conductor 421. In this case, sufficient insulation may not be provided between the bottom conductor 421 and the top conductor 423 at the edges of the bottom conductor 421, which increases the possibility of a shorting failure. As a result, a breakdown limit of the withstand voltage of the capacitor element 411 may be lowered, and a problem therefore arises in that the quality of products becomes inconsistent in terms of voltage withstanding capability. A shorting failure or a reduction in the breakdown limit of the withstand voltage is likely to occur when the thickness of the dielectric film 431 is small relative to the thickness of the bottom conductor 421 or top conductor 423 or when the edges of the bottom conductor 421 are inversely tapered.

Under the circumstance, the dielectric film 431 is formed from a material having high insulating properties or formed with a great thickness in an intention to improve the withstand voltage of the capacitor element 411. However, an increase in the thickness of the dielectric film 431 necessitates an increase in the electrode area of the capacitor element 411 in order to obtain a great capacity, which results in a problem in that it becomes difficult to make the electronic component compact. Further, although the dielectric film 431 covers the top surface and edges of the bottom conductor 421, the thickness of the dielectric film 431 at the edges is smaller than the thickness of the dielectric film 431 on the top surface of the bottom conductor 421 in most cases. When the thickness of the bottom conductor 421 is set at a great value or when the bottom conductor 421 is provided with a great wiring length taking equivalent series resistance (ESR) or parasitic impedance into consideration, a capacity formed between the edges of the bottom conductor 421 and the top conductor 423 has a great capacity value. Thus, variation of the thickness of the dielectric film 431 covering the edges of the bottom conductor 421 has an adverse effect on the achievement of a desired capacity value.

Referring to thin-film type electronic components having a capacitor, reductions in the electrode area and the number of dielectric films have a great importance in providing a small-sized and low-profile capacitor operating at a high frequency at a low cost. The accuracy of the capacity value of the capacitor element 411 depends on the relative positional accuracy of the bottom conductor 421 and the top conductor 423, the accuracy of the shape of the bottom conductor 421 or the top conductor 423, the accuracy of the thickness and dielectric constant of the dielectric film 431, and the surface roughness of the bottom conductor 421 and the top conductor 423. In the case of the capacitor element 411, a general way to improve the relative positional accuracy of the top conductor 423 and the bottom conductor 421 is to change the electrode area of each conductor.

The top conductor formed above the bottom conductor must be smaller in dimensions than the bottom conductor in consideration to a possible shorting between the top conductor and the bottom conductor and their positional accuracy. In particular, when conductors having small dimensions are used, there is a limit on the number of top conductors that can be formed because top conductors are formed in small dimensions to allow some margin for the positional accuracy thereof. Further, the use of a multi-layer top conductor does not necessarily result in an increase in the capacity of a capacitor. In capacitors according to the related art, since a dielectric film is formed in low compliance with a bottom conductor at edges of the conductor, a top conductor is formed so as to avoid the edges in order to prevent shorting between the top conductor and the bottom conductor. Further, bottom conductors of capacitors according to the related art are uneven in the shape of edges thereof. When such edges are used as part of electrodes of the capacitors, there will be significant variations in the electrode area, and the capacity value cannot be accurately controlled. Under the circumstance, in capacitors according to the related art, a dielectric film and a top conductor are formed in the order listed on a planar part of a bottom conductor excluding edges thereof, and a capacity is formed by the area (electrode area) in which the top conductor and the bottom conductor face each other and the thickness of the dielectric film.

In the electronic component having a capacitor, a parasitic inductance or floating capacity is suppressed by adjusting the circuit layout to reduce the distance from the conductors of the capacitor element 411 to terminals and to reduce the length of a lead-out conductor for connecting the capacitor element 411 and a circuit element adjacent to the capacitor element 411.

However, since part of the lead-out conductor is in contact with the dielectric film 431, the capacity value of the capacitor element 411 is different from a design value when there is any misalignment between the positions where the bottom conductor 421 and the top conductor 423 are formed. For example, the lead-out conductor is formed with a small width in order to suppress the deviation of the capacity value of the capacitor from the design value. However, since a reduction in the width of the lead-out conductor results in an increase in the parasitic inductance, there will be problems including degradation of high-frequency characteristics of the electronic component and an increase in transmission loss.

In the thin-film type capacitor element disclosed in Patent Document 1, a bottom electrode and a dielectric layer are formed in the order listed on a substrate, and the periphery of the dielectric layer is covered by an insulator layer having an opening. A top electrode formed on the insulator layer overlies on the dielectric layer in the opening. In such a configuration, the insulator layer covering the periphery of the dielectric layer provides reliable insulation between the bottom electrode and the top electrode. As a result, any reduction or variation of a breakdown voltage attributable to insufficient coverage of the dielectric layer can be reliably prevented. Further, since the capacity value of the capacitor is determined by the opening of the insulator layer, variation of the capacity value can be reduced regardless of the size of the bottom and the top electrodes and the accuracy of alignment of the electrodes.

However, in the capacitor element disclosed in Patent Document 1, since the top electrode is formed also in the same layer as the bottom electrode so as to face the bottom electrode with the insulator layer interposed between them, a parasitic capacity is generated between the electrodes. Since the insulator layer is formed to protrude above the substrate surface, it is difficult to provide the dielectric layer in a multilayer structure. Further, the configuration makes it difficult to provide a composite component having a plurality of circuit elements in a small size because circuit elements such as an inductor element cannot be formed close to the capacitor element.

Patent Document 1: JP-A-2002-25854
Patent Document 2: JP-A-2002-33559
Patent Document 3: JP-A-2003-17366
Patent Document 4: Japanese Patent No. 3193973

SUMMARY OF THE INVENTION

It is an object of the invention to provide an electronic component which has an improved breakdown limit of withstand voltage and improved insulation properties and which can be provided with a small size, a multiplicity of layers and a great capacity.

(1) The above-described object is achieved by an electronic component characterized in that it includes a first conductor having a bottom conductor formed on a substrate and a raised conductor formed to protrude from the bottom conductor, a dielectric film formed on the raised conductor, and a second conductor formed on the dielectric film to constitute a capacity element in combination with the raised conductor and the dielectric film.

(2) The invention provides an electronic component according to the item (1), characterized in that an insulation film having a top surface that is substantially in plane with a top surface of the raised conductor is formed around the raised conductor.

(3) The invention provides an electronic component according to the item (2), characterized in that the dielectric film is formed on the insulation film.

(4) The invention provides an electronic component according to the item (1), characterized in that the second conductor entirely covers the raised conductor when viewed in a normal direction of the substrate.

(5) The invention provides an electronic component according to the item (1), characterized in that a thickness of the dielectric film is smaller than a thickness of the raised conductor.

(6) The invention provides an electronic component according to the item (2), characterized in that a thickness of the dielectric film is smaller than a thickness of the insulation film.

(7) The invention provides an electronic component according to the item (2), characterized in that a dielectric constant of the dielectric film is greater than a dielectric constant of the insulation film.

(8) The invention provides an electronic component according to the item (1), characterized in that it further includes a circuit element formed on the substrate and electrically connected to the capacity element.

(9) The invention provides an electronic component according to the item (2), characterized in that the insulation film has a via opening.

The invention makes it possible to provide an electronic component which has an improved breakdown limit of withstand voltage and improved insulation properties and which can be provided with a small size, a multiplicity of layers and a great capacity.

DESCRIPTION OF THE PREFERRED EMBODIMENTS

First Embodiment

Figure 1A:
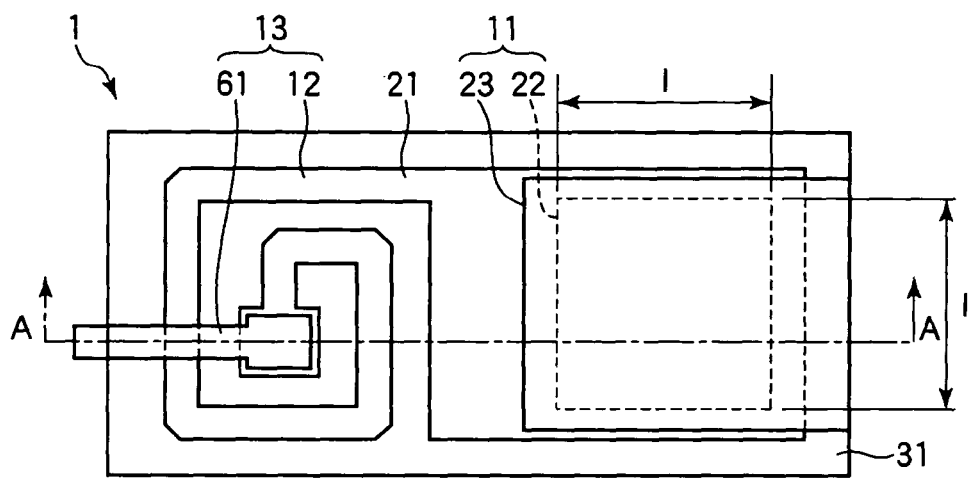
FIGS. 1A, 1B, and 1C show an electronic component 1 according to a first embodiment of the invention.
Figure 1B:
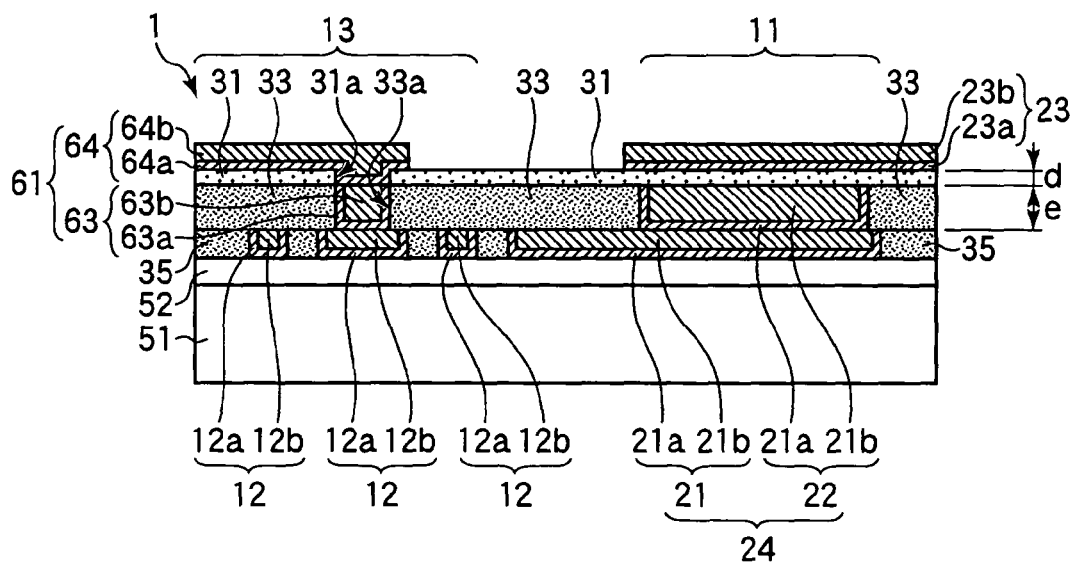
Figure 1C:
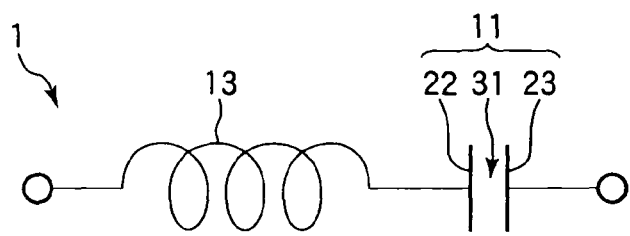

An electronic component according to a first embodiment of the invention will now be described with reference to FIGS. 1A to 12B. First, an electronic component 1 of the present embodiment will be described with reference to FIGS. 1A to 1C. FIG. 1A is a plan view of the electronic component 1, and FIG. 1B is a sectional view taken along the line A-A in FIG. 1A. FIG. 1C is an equivalent circuit diagram of the electronic component 1. In FIG. 1A, hidden lines are indicated by broken lines.

As shown in FIGS. 1A and 1B, the electronic component 1 includes a capacitor element (capacity element) 11 and an inductor element (circuit element) 13 electrically connected to the capacitor element 11 which are formed using thin-film forming techniques, and the component has a general outline in the form of a rectangular parallelepiped. Referring to FIG. 1A, the length of the longer sides of the electronic component 1 extending in the horizontal direction and the length of the shorter sides of the same extending in the vertical direction in the figure are substantially at a ratio of 2:1. As shown in FIG. 1C, the capacitor element 11 and the inductor element 13 are connected in series to form a series resonance circuit.

As shown in FIG. 1B, the electronic component 1 of the present embodiment employs a smooth substrate 51 having a planarized layer 52 formed on a surface thereof. The substrate 51 is formed from alumina ($Al_2O_3$). The planarized layer 52 is formed from alumina, and the surface of the planarized layer 52 is planerized by polishing the same using a CMP (chemical mechanical polishing) process.

The electronic component 1 includes a coil conductor 12 formed on the planarized layer 52 of the substrate 51 and having a spiral shape when viewed in the normal direction of the substrate 51 and via openings 31a and 33a provided in a dielectric film 31 and an insulation film 33, respectively, above an inner end of the coil conductor 12.

A lead-out conductor 61, which is in contact with the inner end of the coil conductor 12 at the via opening 33a, is formed in the via openings 31a and 33a and above the dielectric film 31. The inductor element 13 is constituted by the coil conductor 12 and the lead-out conductor 61. An outer end of the coil conductor 12 is electrically connected to a bottom conductor 21. The coil conductor 12 and the bottom conductor 21 are formed to be integral with each other. The lead-out conductor 61 and a top conductor 23 constitute terminals for energizing the electronic component 1.

The coil conductor 12 includes an underlying conductor 12a made of Ti and Cu or chromium (Cr) and Cu and formed to constitute the bottom and sides of the coil conductor 12 and a conductor 12b made of Cu and formed on the underlying conductor 12a. For example, the thickness of the coil conductor 12 is 8 μm. In order to suppress transmission loss by reducing DC resistive components, the bottom conductor 21 and the coil conductor 12 have a relatively great thickness. The coil conductor 12 is constituted by a coil having one turn only, as shown in FIG. 1A.

The lead-out conductor 61 is electrically connected to the coil conductor 12. The lead-out conductor 61 includes a conductor 63 formed in the via opening 33a and a conductor 64 formed in the via opening 31a and on the dielectric film 31. The conductor 63 includes a Ti/Cu underlying conductor 63a formed to constitute the bottom and sides of the conductor 63 and a Cu conductor 63b formed on the underlying conductor 63a. The conductor 64 includes a Ti/Cu underlying conductor 64a formed on the dielectric film 31 and formed to constitute the bottom and sides of the via opening 31a and a Cu conductor 64b formed on the underlying conductor 64a. The conductor 64 is formed in the form of an elongate rectangle extending on the dielectric film 31 from the via opening 31a up to the periphery of the electronic component 1 on a shorter side thereof.

The conductor 63 at a via portion of the lead-out conductor 61 is formed in the via opening 33a provided in the insulation film 33, and sides of the conductor are covered by the insulation film 33. Thus, reliable connection and insulation can be maintained at the via portion, and the reliability of connection at the via portion can be improved. The electronic component 1 can therefore be provided with improved reliability.

The electronic component 1 also includes a first conductor 24 having a bottom conductor 21 formed on the planarized layer 52 of the substrate 51 and a raised conductor 22 formed in the form of a post protruding from the bottom conductor 21, a dielectric film 31 formed on the raised conductor 22, and a top conductor (second conductor) 23 formed on the dielectric film 31 to constitute a capacitor element (capacitor element) 11 in combination with raided conductor 22 and the dielectric film 31.

As shown in FIG. 1A, the bottom conductor 21 has a rectangular shape when the substrate 51 is viewed in the normal direction thereof. The bottom conductor 21 is formed at the same time, in the same layer, and from the same material as the coil conductor 12. For example, the thickness of the bottom conductor 21 is 8 μm. The bottom conductor 21 includes an underlying conductor 21a made of titanium (Ti) and copper (Cu) and formed to constitute the bottom and sides of the bottom conductor 21 and a conductor 21b made of Cu and formed on the bottom conductor 21a.

An insulation film 35 is formed around the bottom conductor 21 and the coil conductor 12 and in a gap between them. The insulation film 35 is formed from a photosensitive resin such as photosensitive polyimide. The thickness of the insulation film 35 is substantially equal to the thickness of the bottom conductor 21 and the coil conductor 12, and the bottom conductor 21, the coil conductor 12, and the insulation film 35 are formed to have a smooth surface.

As shown in FIGS. 1A and 1B, the capacitor element 11 is constituted by the raised conductor 22, the dielectric film 31, and the top conductor 23. For example, the raised conductor 22 is in the form of a thin plate having a length l per side of 100 μm and a thickness e of 8 μm and is formed substantially in the middle of the bottom conductor 21. The raised conductor 22 is formed at the same time, in the same layer, and from the same material as the conductor 63. The raised conductor 22 includes an underlying conductor 22a made of titanium (Ti) and copper (Cu) and formed to constitute the bottom and sides of the raised conductor 22 and a conductor 22b made of Cu and formed on the underlying conductor 22a.

The part of the bottom conductor 21 on which the raised conductor 22 is not formed serves as a lead-out conductor. The lead-out conductor is the rectangular region which is sandwiched between the raised conductor 22 and the coil conductor 12 in FIG. 1A.

As shown in FIG. 1B, the insulation film 33 is formed on the coil conductor 12, the bottom conductor 21, and the insulation film 35. The insulation film 33 is formed from a photosensitive resin such as photosensitive polyimide. The material of the insulation film 33 must have heat-resisting properties. The insulation film 33 is formed in the same layer as the raised conductor 22 and the conductor 63 so as to cover the periphery of the raised conductor 22 and the conductor 63. The insulation film 33 is formed substantially throughout the substrate 51 excluding the regions of the same where the raised conductor 22 and the conductor 63 are formed. Each of the raised conductor 22, the insulation film 33, and the conductor 63 are formed to have a smooth surface, and the thickness of the insulation film 33 is substantially equal to the thickness e of the raised conductor 22 and the conductor 63. The insulation film 33 has a top surface which is substantially in plane with top surfaces of the raised conductor 22 and the conductor 63.

Unlike the thin-film capacitor element disclosed in Patent Document 1, the electronic component 1 includes the insulation film 33 having a planar surface instead of an insulation layer in the form of a protrusion above the substrate surface. The electronic component 1 can therefore be easily formed to have a multiplicity of layers. For example, a capacitor element 11 having a large capacity can be provided by forming a multiplicity of dielectric films 31 one over another. Further, since no insulation layer in the form of a protrusion is formed at the periphery of the capacitor element 11, an inductor element 13 can be formed in the neighborhood of the capacitor element 11. Thus, the electronic component 1 can be formed in a small size.

As shown in FIG. 1B, the dielectric film 31 is formed on the raised conductor 22 and the insulation film 33. The dielectric film 31 is flatly formed substantially throughout the substrate 51 excluding the via opening 31a. For example, the dielectric film 31 is formed with a thickness d of 0.1 μm which is smaller than the thickness e of the raised conductor 22 and the thickness of the insulation film 33. For example, alumina, silicon nitride ($Si_4N_3$), tantalum oxide ($Ta_2O_5$) or aluminum nitride (AlN) is used as the material of the dielectric film 31. The dielectric film 31 is made of a material having a dielectric constant higher than the insulation film 33.

The top conductor 23 is formed on the dielectric film 31 on the raised conductor 22. The top conductor 23 is formed to cover the raised conductor 22 entirely when viewed in the normal direction of the substrate surface of the substrate 51. The top conductor 23 extends on the dielectric film 31 up to a peripheral part of the electronic component 1 on a shorter side thereof. The top conductor 23 is not formed in the same layer where the bottom conductor 21 and the raised conductor 22 reside. As shown in FIG. 1A, the top conductor 23 has a rectangular shape when viewed in the normal direction of the substrate surface of the substrate 51. The top conductor 23 has a thickness of, for example, 8 μm. The top conductor 23 is formed at the same time, in the same layer, and from the same material as the conductor 64.

The top conductor 23 includes a Ti/Cu underlying conductor 23a formed on the dielectric film 31, and a Cu conductor 23b formed on the underlying conductor 23a. The top conductor 23 includes an electrode portion which faces the raised conductor 22 to serve as an electrode of the capacitor element 11 and a lead-out conductor which is formed to extend on the dielectric film 31 up to the periphery of the electronic component 1 on the shorter side thereof to connect the electrode portion with an external electrode (not shown) formed on that side of the electronic component 1. Since the top conductor 23 is formed to cover the raised conductor 23 when viewed in the normal direction of the substrate surface of the substrate 51, the electrode area of the capacitor element 11 is determined by the an area $l^2$ of the raised conductor 22.

The dielectric film 31 is formed on a planar surface. Therefore, even when the dielectric film 31 is formed with a small thickness, the thickness of the dielectric film 31 can be made uniform even at edges of the raised conductor 22. As a result, shorting is prevented between the raised conductor 22 and the top conductor 23. The breakdown limit value of the withstand voltage and the insulating properties of the electronic component 1 are thus improved, and variation of the quality of the electronic component 1 is suppressed between products thus manufactured. Since shorting between the top conductor 23 and the raised conductor 22 can be prevented even when the top conductor 23 is formed on the dielectric film 31 at the edges of the raised conductor 22, the top conductor 23 can be formed even on the edges of the conductor 22, which allows the capacitor element 11 to have a great electrode area.

Since there is no need for providing the dielectric film 31 with a great thickness to prevent shorting between the raised conductor 22 and the top conductor 23, the thickness of the dielectric film 31 can be one-tenth or less of such a thickness according to the related art (2 to 3 μm), which makes it possible to obtain a capacitor element 11 having a great capacity. Since a sufficient capacity can be obtained even if the capacitor element 11 has a small electrode area, the electronic component 1 can be made compact. For example, the length l per side of the raised conductor 22 may be 50 μm or 30 μm or even smaller to make the electronic component 1 compact. Further, since a sufficient capacity can be obtained without providing the dielectric film 31 in a multi-layer structure, the electronic component 1 can be provided with a low profile.

A description will now be made with reference to Table 1 on how the capacity values of the capacitor element 411 according to the related art and the capacitor element 11 of the present embodiment deviate from design values under the influence of deviations of the top conductor forming position, deviations of the areas of the top conductor 423 and the raised conductor 22 (variations in the shape of the same), variations of the top conductor thickness, and variations of the thickness f of the dielectric film 431 formed on sides of the bottom conductor 421 in the capacitor element 411 according to the related art.

Table 1 shows a comparison between the capacitor element 411 according to the related art and the capacitor element 11 of the present embodiment on results of a simulation and analysis of deviations of the capacity values from the design values under conditions 1 to 10 which are different from each other in terms of the deviation of the top conductor forming position (forming positions), the deviation of the area of the top conductor 423 and the raised conductor 22 (conductor area), the variation of the top conductor thickness (conductor thickness), and the variation of the thickness f of the dielectric film 431 formed on sides of the bottom conductor 421 (sidewall film thickness).

Figure 20A:
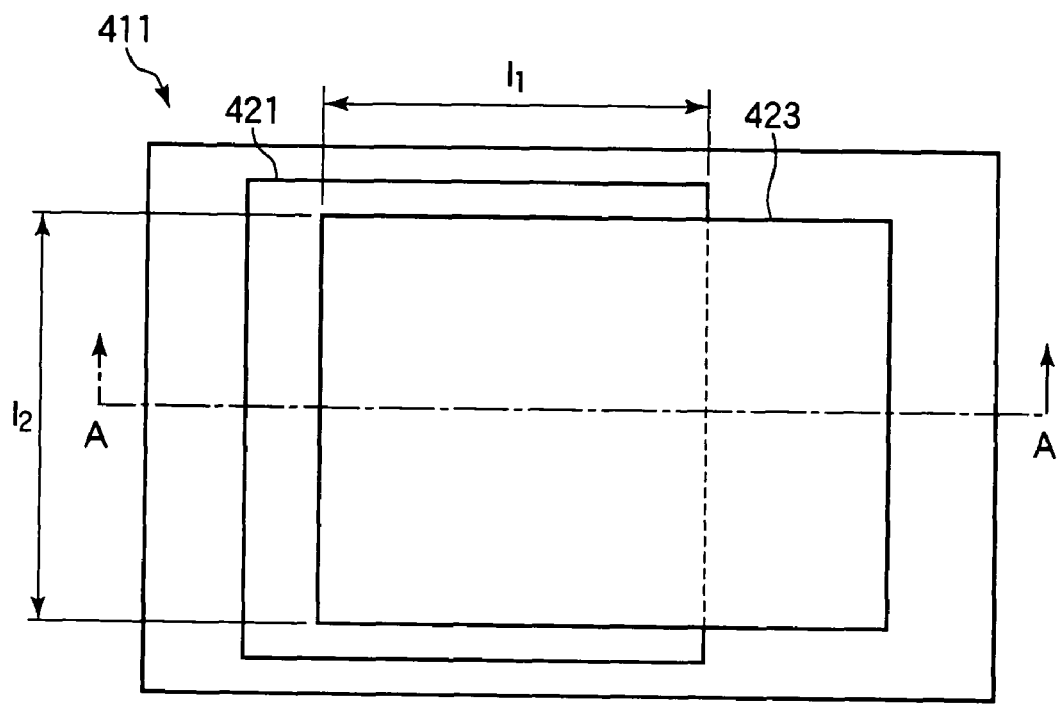
FIGS. 20A and 20B illustrate a capacitor element 411 according to the related art.

The conditions 1 to 10 are as follows. Referring to FIGS. 1A and 20A, the conditions 1 and 2 are states in which the top conductors are formed in positions deviating by 5 μm from the design values to the left (in the negative (−) direction) or to the right (in the positive (+) direction). The conditions 3 and 4 are states in which the top conductor 423 and the raised conductor 22 are formed with areas deviating from the design values as a result of a shortage of −5 μm or excess of +5 μm per side. The condition 5 is a state in which the deviations under the conditions 1 and 3 occur at the same time. The condition 6 is a state in which the deviations under conditions 2 and 4 occur at the same time. The condition 7 is a state in the deviations under the condition 5 and a +1 μm deviation of the top conductor thicknesses from the design values occur at the same time. The condition 8 is a state in the deviations under the condition 6 and a −1 μm deviation of the top conductor thicknesses from the design values occur at the same time. The condition 9 is a state of the capacitor element 411 in which the deviation under the condition 7 is accompanied by a +5% deviation of the thickness f of the dielectric film 431 formed on the sides of the bottom conductor 421 from the design value. The condition 10 is a state of the capacitor element 411 in which the deviation under the condition 8 is accompanied by a −5% deviation of the thickness f of the dielectric film formed on the sides of the bottom conductor from the design value.

The design values used for the simulation and analysis were as follows. The length l per side of the raised conductor 22 and lengths l1 and l2 of the sides of the top conductor 423 facing the bottom conductor 421 were 100 μm; the thickness of the top conductors was 8 μm; the dielectric constant of the dielectric films was 7.5; and the thickness d of the dielectric films was 0.1 μm. It was assumed that the bottom conductors were formed according to the design values. The thickness f of the dielectric film 431 formed on the sides of the bottom conductor 421 was 0.1 μm. The capacity design value was 7.172 pF for the capacitor element 411 according to the related art and 6.651 pF for the capacitor element 11 of the present embodiment.

As shown in Table 1, when the top conductor is formed in a position deviating by 5 μm from the design value to the left or right (conditions 1 and 2), the capacity value of the capacitor element 411 according to the related art has a deviation in the range of −4.6% to 4.6% from the design value, whereas the capacity value of the capacitor element 11 of the present embodiment does not deviate from the design value.

When the top conductor 421 or the raised conductor 22 is formed with an area deviating from the design value as a result of a shortage of −5 μm or excess of +5 μm per side (conditions 3 and 4), the capacity value of the capacitor element 411 according to the related art has a deviation in the range of −7.2% to 7.4% from the design value, whereas the capacity value of the capacitor element 11 of the present embodiment has a deviation in the range of −9.7% to 10.2% from the design value. The capacitor element 11 of the present embodiment has a greater deviation of the capacity value than the capacitor element 411 according to the related art.

When the positions of the top conductors and the area of the top conductor 421 or the raised conductor 22 deviate from the respective design values (conditions 5 and 6), the capacity value of the capacitor element 411 according to the related art has a deviation in the range of −11.6% to 12.3% from the design value, whereas the capacity value of the capacitor element 11 of the present embodiment has a deviation in the range of −9.7% to 10.2% from the design value. The capacitor element 11 of the present embodiment has a smaller deviation of the capacity value than the capacitor element 411 according to the related art.

When the positions and thicknesses of the top conductors and the area of the top conductor 421 or the raised conductor 22 deviate from the respective design values (conditions 7 and 8), the capacity value of the capacitor element 411 according to the related art has a deviation in the range of −10.7% to 11.3% from the design value, whereas the capacity value of the capacitor element 11 of the present embodiment has a deviation in the range of −9.7% to 10.2% from the design value. The capacitor element 11 of the present embodiment has a smaller deviation of the capacity value than the capacitor element 411 according to the related art. The capacitor element 11 of the present embodiment has no deviation of the capacity value from the design value even when the thickness of the top conductor 23 deviates from the design value.

When the positions and thicknesses of the top conductors, the area of the top conductor 421 or raised conductor 22, and the thickness f of the dielectric film 431 formed on the sides of the bottom conductor 421 deviate from the respective design values (conditions 9 and 10), the capacity value of the capacitor element 411 according to the related art has a deviation in the range of −11.1% to 11.7% from the design value, whereas the capacity value of the capacitor element 11 of the

TABLE 1

| Condition | Forming Position | Conductor Area | Conductor Thickness | Sidewall Film Thickness | Related Art | Present Embodiment |
|---|---|---|---|---|---|---|
| 1 | −5 μm | 0 | 0 | 0 | 4.6% | 0.0% |
| 2 | +5 μm | 0 | 0 | 0 | −4.6% | 0.0% |
| 3 | 0 | −5 μm | 0 | 0 | −7.2% | −9.7% |
| 4 | 0 | +5 μm | 0 | 0 | 7.4% | 10.2% |
| 5 | −5 μm | −5 μm | 0 | 0 | −11.6% | −9.7% |
| 6 | +5 μm | +5 μm | 0 | 0 | 12.3% | 10.2% |
| 7 | −5 μm | −5 μm | +1 μm | 0 | −10.7% | −9.7% |
| 8 | +5 μm | +5 μm | −1 μm | 0 | 11.3% | 10.2% |
| 9 | −5 μm | −5 μm | +1 μm | +5% | −11.1% | −9.7% |
| 10 | +5 μm | +5 μm | −1 μm | −5% | 11.7% | 10.2% | present embodiment has a deviation in the range of −9.7% to 10.2% from the design value. The capacitor element 11 of the present embodiment has a smaller deviation of the capacity value than the capacitor element 411 according to the related art.

As described above, the top conductor 23 of the capacitor element 11 of the present embodiment is formed to cover the raised conductor 22 when viewed in the normal direction of the substrate surface of the substrate 51, and the electrode area of the capacitor element 11 is determined by the area $l^2$ of the raised conductor 22. Therefore, there is no deviation of the capacity value even when the top conductor 23 is formed in a deviated position. Further, the top conductor 23 is not formed in the same layer where the bottom conductor 21 resides. Since the top conductor 23 and the bottom conductor 21 cannot therefore face each other, it is possible to prevent the generation of a parasitic capacity between the sides of the bottom conductor 21 and the top conductor 23. As a result, the capacity value does not deviate from the design value even when the thickness of the top conductor 23 deviates from the design value. The capacitor element 411 according to the related art has a problem in that any deviation of the thickness f of the dielectric film 431 formed on the sides of the bottom conductor 421 from the design value can result in a deviation of the capacity value from the design value. On the contrary, capacitor element 11 of the present embodiment does not have the problem encountered in the related art because the top conductor 23 is not formed in the same layer as the bottom conductor 21 and the dielectric film 31 is not formed on sides of the bottom conductor 21. In the case of the capacitor element 11 of the present embodiment, the deviation of the capacity value can therefore be made about ±2% smaller than that in the capacitor element 411 according to the related art.

Figure 2:
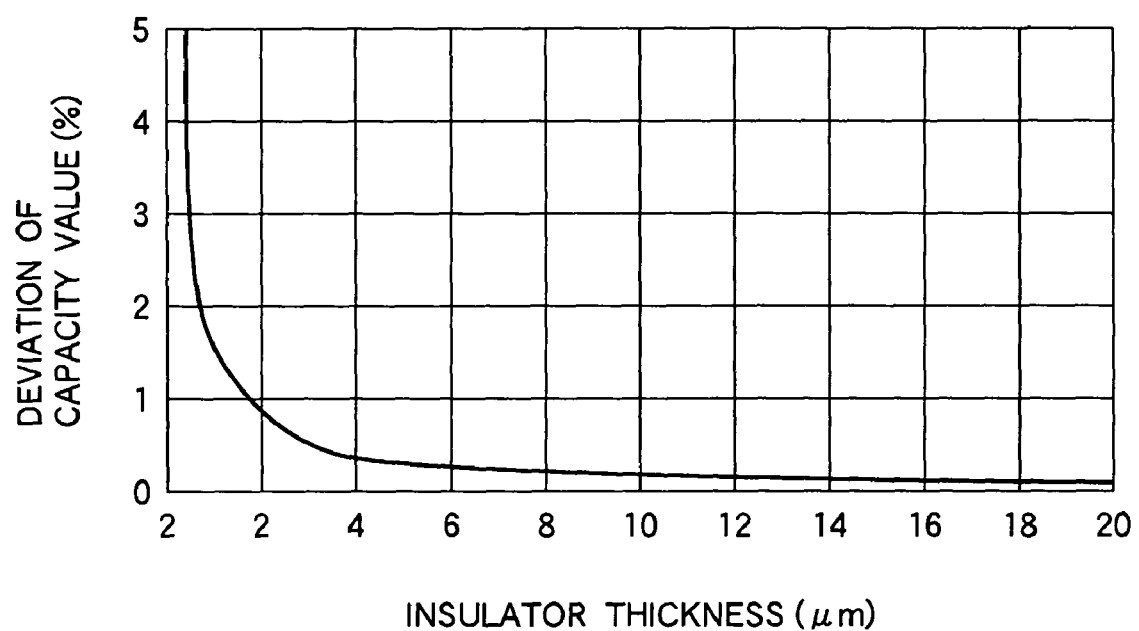
FIG. 2 is a graph showing a relationship between the thickness of an insulation film 33 and deviations of the capacity value of a capacitor element 11.

A description will be made with reference to FIG. 2 on a relationship between the thickness of the insulation film 33 and deviations of the capacity value of the capacitor element 11 from a design value. FIG. 2 shows results of a simulation and analysis of the relationship between the thickness of the insulation film 33 and deviations of the capacity value of the capacitor element 11 from a design value. In FIG. 2, the abscissa axis represents the thickness (μm) of the insulation film 33, and the ordinate axis represents deviations of the capacity value of the capacitor element 11 from a design value in percentages (%).

Design values used in the simulation and analysis are as follows. The length l per side of the raised conductor 22 was 50 μm. The area over which the bottom conductor 21 and lead-out conductor of the top conductor 23 faced each other was 50×8 μm. The relative dielectric constant of the insulation film 33 was 4. The thickness d of the dielectric film 31 was 0.1 μm. The design value of the capacity was 0.886 pF. It was assumed that the bottom conductor 21, the raised conductor 22, and the top conductor 23 were formed according to the design values.

Since the capacity value of a capacitor is inversely proportionate to the distance between electrodes thereof in general, a parasitic capacity generated between the bottom conductor 21 and the lead-out conductor of the top conductor 23 is smaller, the greater the thickness of the insulation film 33. Therefore, as shown in FIG. 2, the amount of deviation of the capacity value of the capacitor element 11 is substantially inversely proportionate to the thickness of the insulation film 33. Incidentally, the thin-film capacitor element disclosed in Patent Document 1 has a structure in which sides of a bottom electrode are disposed opposite to a top electrode with an insulator layer interposed between them. The thickness of the insulation layer is smaller, the smaller the thin-film capacitor element. Thus, the ratio of a parasitic capacity to the capacity value of the thin-film capacitor element increases.

On the contrary, the electronic component 1 of the present embodiment has a structure in which the top conductor 23 is not disposed opposite to the sides of the bottom conductor 21. Thus, a parasitic capacity generated between the sides of the bottom conductor 21 and the top conductor 23 undergoes substantially no change regardless of the size of the electronic component 1. Therefore, there is no increase in the ratio of the parasitic capacity to the capacity value of the capacitor element 11 even when the size of the electronic component 1 is reduced, and the capacity value of the capacitor element 11 is determined by the area $l^2$ over which the top conductor 23 and the raised conductor 22 face each other (electrode area) and the thickness d and dielectric constant of the dielectric film 31 sandwiched between the top conductor 23 and the raised conductor 22. It is therefore possible to provide an electronic component 1 which is compact and whose capacitor element 11 has an accurate capacity value. An increase in the thickness of the insulation film 33 allows the capacitor element 11 to have a more accurate capacity value because capacitive coupling can be suppressed at wirings surrounding the same such as the lead-out conductor.

An increase in the thickness of the insulation film 33 allows any parasitic inductance or floating capacity generated between the lead-out conductor of the top conductor 23 and the same of the bottom conductor 21 to be suppressed. The accuracy of the capacity value of the capacitor element 11 can be thus improved. The degradation of transmission characteristics in a high frequency range can be also suppressed. Further, since desired circuit constants can be obtained, the designing of a high frequency circuit is facilitated.

In the case of a thin-film type capacitor element, capacitive coupling of the element and wirings surrounding the same has greater influence on the capacity value, the greater the capacity value achieved by a small facing area. It is advantageous to increase the thickness of the insulation film 33 in obtaining a desired capacity value of the capacitor element 11 while reducing the size of the capacitor element 11. Variations of the capacity value between products can be suppressed by reducing variations of the thickness of the insulation film 33.

An increase in the thickness of the insulation film 33 results in a reduction of any floating capacity between the coil conductor 12 and the lead-out conductor 61, which makes it possible to adapt the self-resonant frequency and antiresonant frequency of the inductor element 13 to high frequencies and to improve the Q-characteristics of the same. For example, the invention allows a reduction of insertion loss, mitigates the suppression of an attenuation of out-of-band characteristics, and improves the steepness of an attenuation band when used in a filter circuit employing an LC resonance circuit which is similar in structure to the capacitor element 11 and the inductor element 13. When it is attempted to reduce the thickness of the capacitor element 11 by reducing the thickness of the insulation film 33, the distance between the bottom conductor 21 and the top conductor 23 may be changed in an active way to reduce the thickness of the insulation film 33 and the height of the raised conductor 22, whereby capacitive coupling which occurs between lead-out conductors can be used as the capacity of the capacitor element 11.

An increase in the thickness of the insulation film 33 also makes it possible to suppress magnetic coupling and capacitive coupling between the coil conductor 12 and wirings (e.g., the lead-out conductor 61, a ground wiring, a power supply wiring, a shield wiring, and wirings for the inductor element and the capacitor element 11) provided opposite to the wiring of the coil conductor 12.

Electromagnetic coupling and capacitive coupling may be intentionally generated by adjusting the thickness and dielectric constant of the insulation film 33 to bring out transmission characteristics at a desired frequency band, whereby the characteristics of the electronic component 1 can be improved. Parasitic components may be utilized in an active manner by adjusting the thickness and dielectric constant of the insulating material, whereby magnetic coupling is effectively caused, and AC components are advantageously brought out to suppress DC components. The transmission loss of the electronic component 1 can be thus reduced.

As described above, the dielectric film 31 in the electronic component 1 of the present embodiment is formed on a planar surface. Therefore, the thickness of the dielectric film 31 can be made uniform even at edges of the raised conductor 22 even when the thickness of the dielectric film 31 is small, which makes it possible to prevent a shorting between the raised conductor 22 and the top conductor 23. As a result, the electronic component 1 can be provided with an improved breakdown limit value of withstand voltage and improved insulation properties, and variation of the quality of the electronic component 1 is suppressed between products thus manufactured.

The top conductor 23 is not formed in the same layer where the bottom conductor 21 resides, and the sides of the bottom conductor 21 do not face the sides of the top conductor 23. It is therefore possible to prevent the generation of any parasitic capacity between the sides of the bottom conductor 21 and the sides of the top conductor 23. The accuracy of the capacity value of the capacitor element 11 can be improved by forming the same to have an accurate electrode area that is determined by the area $l^2$ of the raised conductor 22. Further, the generation of a parasitic capacity between the bottom conductor 21 and the lead-out conductor of the top conductor 23 can be prevented by forming the insulation film 33 with a great thickness, which allows the accuracy of the capacity value to be improved.

Since the insulation film 33 having a planar surface is used, the electronic component 1 can be easily provided with a great number of layers. Since the top conductor 23 can be formed on even the dielectric film 31 at edges of the raised conductor 22, the top conductor 23 can be formed greater than the raised conductor 22. It is therefore possible to provide a multi-layer capacitor element having a great capacity by alternately forming a multiplicity of the dielectric films 31 and conductors.

A method of manufacturing an electronic component 1 according to the present embodiment will now be described with reference to FIGS. 3A to 7. A multiplicity of electronic components 1 are simultaneously formed on a wafer, and FIGS. 3A to 7 show an element forming region of one of the electronic components 1. FIGS. 3A to 7 are sectional views of the electronic component 1 of the present embodiment showing steps of manufacturing the same.

In the present embodiment, a substrate 51 having a planarized surface is used. First, a surface of the substrate 51 which is formed from alumina ($Al_2O_3$) is polished using a CMP (chemical mechanical polishing) process to form a planarized layer 52.

Figure 3A:
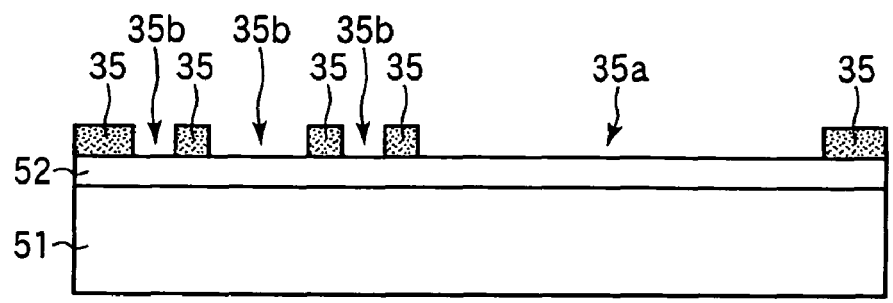
FIGS. 3A, 3B, and 3C are sectional views showing a method of manufacturing the electronic component 1 according to the first embodiment of the invention.

Next, a photosensitive resin such as polyimide is applied to the entire surface to form an insulation film 35. Next, pre-baking is performed on the insulation film 35. Next, as shown in FIG. 3A, the insulation film 35 is exposed and developed to form the insulation film 35 with an opening 35a which has a rectangular shape when viewed in the normal direction of the substrate 51 and an opening 35b which has a spiral shape when viewed in the same direction. An outer end of the opening 35b is connected to the opening 35a. Post-baking is then performed on the insulation film 35.

Figure 3B:
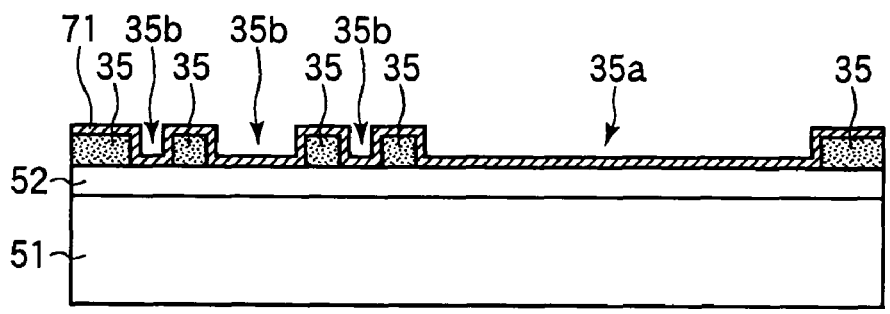

Next, as shown in FIG. 3B, an underlying conductor 71 is formed by stacking a film of titanium (Ti) having a thickness of about 30 nm and a film of copper (Cu) having a thickness of about 100 nm in the order listed on the entire surface using, for example, a sputtering process. The underlying conductor 71 is formed on the sides and bottoms of the openings 35a and 35b.

Figure 3C:
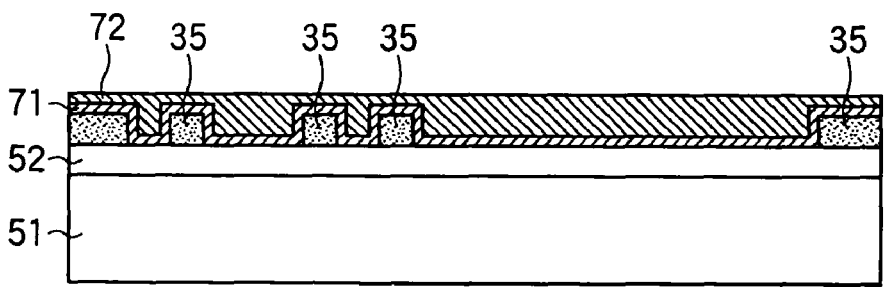
Figure 4A:
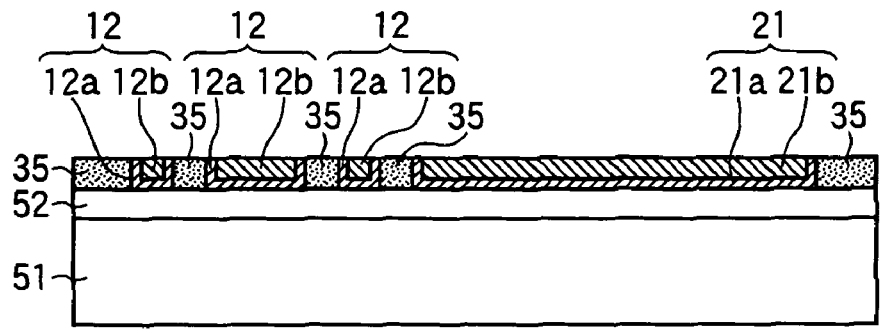
FIGS. 4A, 4B, and 4C are sectional views showing the method of manufacturing the electronic component 1 according to the first embodiment of the invention.

Next, as shown in FIG. 3C, a copper (Cu) conductor 72 having a thickness of 9 to 10 μm is formed on the underlying conductor 71 using an electroplating process. Then, as shown in FIG. 4A, the entire surface is polished using a CMP process until the insulation film 35 is exposed to form conductor patterns. Thus, a bottom conductor 21 having a thickness of about 8 μm is formed in the opening 35a, and a coil conductor 12 having the same thickness is simultaneously formed in the opening 35b. The bottom conductor 21 includes an underlying conductor 21a constituted by the underlying conductor 71 and a conductor 21b constituted by the conductor 72. The coil conductor 12 includes an underlying conductor 12a constituted by the underlying conductor 71 and a conductor 12b constituted by the conductor 72.

While a damascene process is used to form the bottom conductor 21 and the coil conductor 12 in the present embodiment, the conductors may alternatively be formed using a semi-additive process (deposition process), a subtractive process (etching process) or a lift-off process. A raised conductor 22, a top conductor 23, and a lead-out conductor 61 which will be described later are formed using the same method as for the bottom conductor 21 and the coil conductor 12. The coil conductor 12 and a lead-out conductor 61 to be described later may be disposed in either of the layers where the bottom conductor 21 and the top conductor 23 are disposed, and they may be freely disposed taking the easiness of a wiring design and the electrical characteristics and shape of an inductor element 13 into consideration. Further, openings and grooves in the insulation film 33 to be described later may be processed using, a laser, plasma ashing, or wet etching.

Figure 4B:
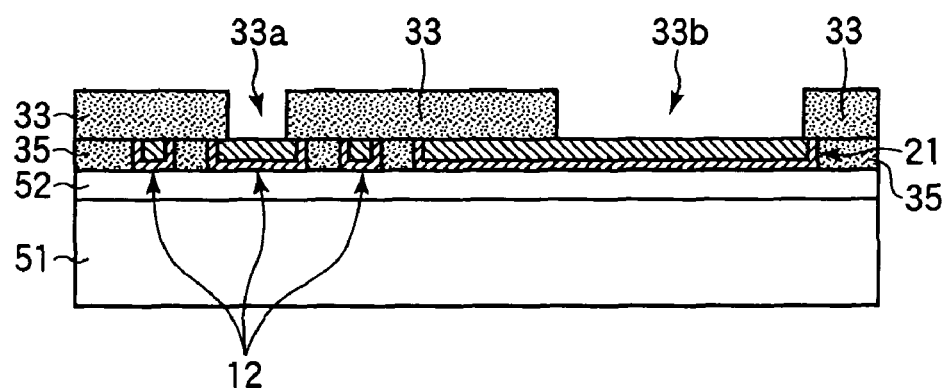

Next, a photosensitive resin such as polyimide is applied to the entire surface to form an insulation film 33. Pre-baking is then performed on the insulation film 33. Next, as shown in FIG. 4B, the insulation film 33 is exposed and developed to form the insulation film 33 with a via opening 33b at which an inner end of the coil conductor 12 is exposed. At the same time, the insulation film 33 is formed with an opening 33b at which part of the bottom conductor 21 is exposed. Post-baking is then performed on the insulation film 33.

Figure 4C:
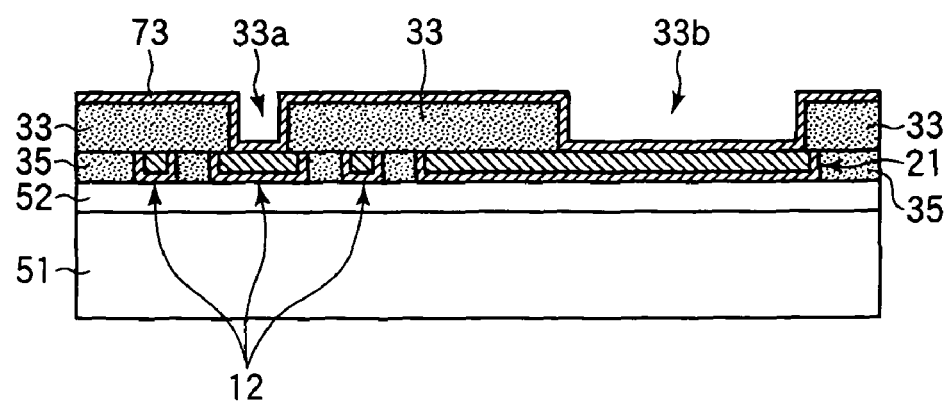

Next, as shown in FIG. 4C, a layer of titanium (Ti) having a thickness of about 30 nm and a layer of copper (Cu) having a thickness of about 100 nm are formed in the order listed on the entire surface using, for example, a sputtering process, thereby forming an underlying conductor 73. The underlying conductor 73 is formed also on the sides and bottoms of the via opening 33a and the opening 33b.

Figure 5A:
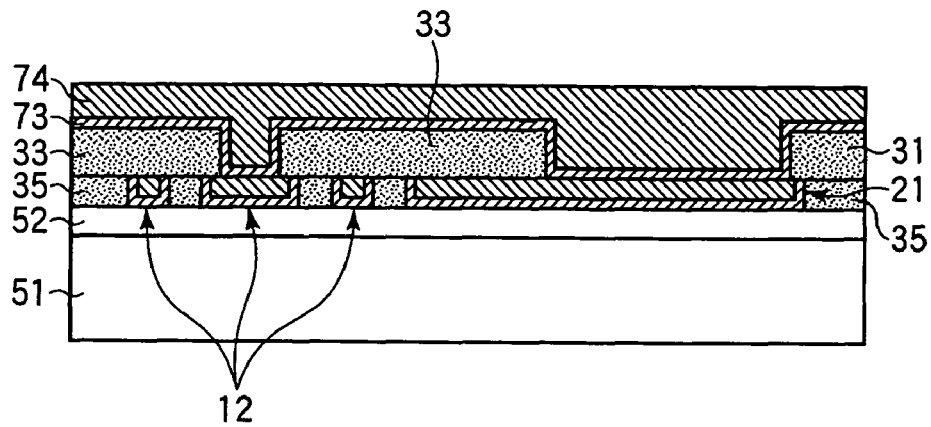
FIGS. 5A, 5B, and 5C are sectional views showing the method of manufacturing the electronic component 1 according to the first embodiment of the invention.
Figure 5B:
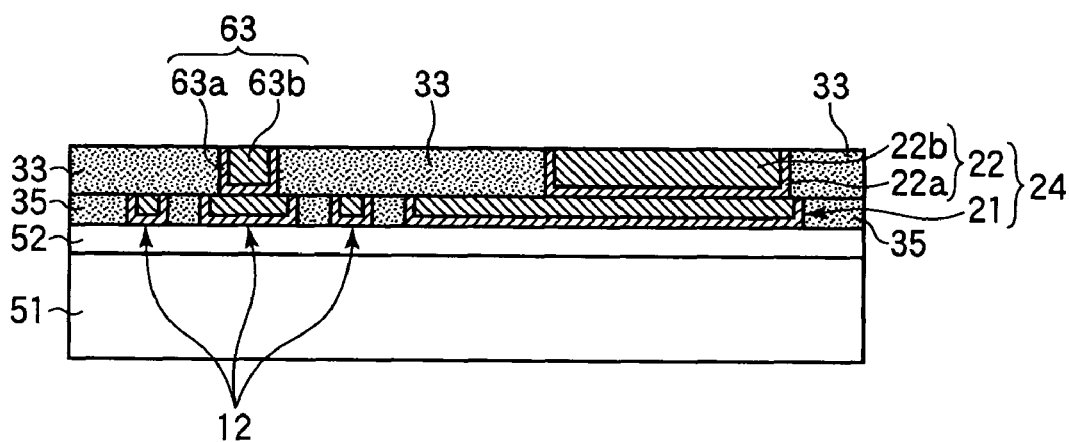

Next, as shown in FIG. 5A, a copper (Cu) conductor 74 having a thickness of 9 to 10 μm is formed on the underlying conductor 73 using an electroplating process. Then, as shown in FIG. 5B, the entire surface is polished using a CMP process until the insulation film 33 is exposed to form conductor patterns. Thus, a conductor 63 having a thickness of about 8 μm is formed in the via opening 33a, and a raised conductor 22 having the same thickness is simultaneously formed in the opening 33b. The raised conductor 22 includes an underlying conductor 22a constituted by the underlying conductor 73 and a conductor 22b constituted by the conductor 74. The conductor 63 includes an underlying conductor 63a constituted by the underlying conductor 73 and a conductor 63*b* constituted by the conductor 74.

Figure 5C:
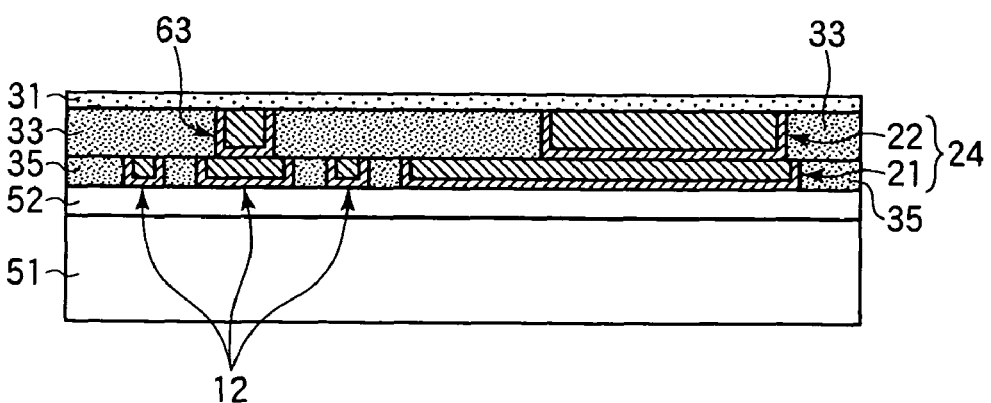

Next, as shown in FIG. 5C, a dielectric film 31 having a thickness of about 0.1 µm is formed throughout the surface. Referring to the material of the dielectric film 31, for example, alumina, silicon nitride ($Si_4N_3$), or silicon dioxide ($SiO_2$) is used. The dielectric film 31 is formed on a planar surface.

Figure 6A:
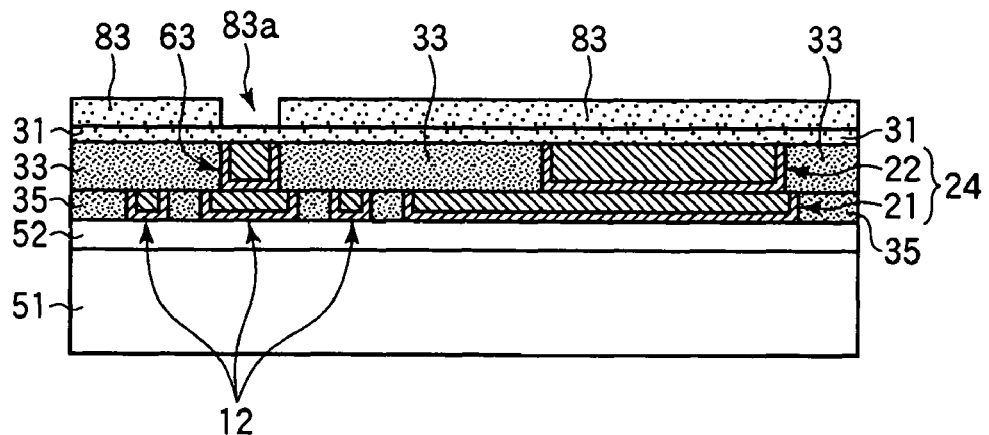
FIGS. 6A, 6B, and 6C are sectional views showing the method of manufacturing the electronic component 1 according to the first embodiment of the invention.

A photosensitive resin is then applied to the entire surface of the dielectric film 31 to form a photosensitive resin layer 83. Next, as shown in FIG. 6A, the photosensitive resin layer 83 is exposed and developed to form an opening 83*a* in the photosensitive resin layer 83 above the inner end of the coil conductor 12. Post baking (a heating process) is then performed on the photosensitive resin layer 83.

Figure 6B:
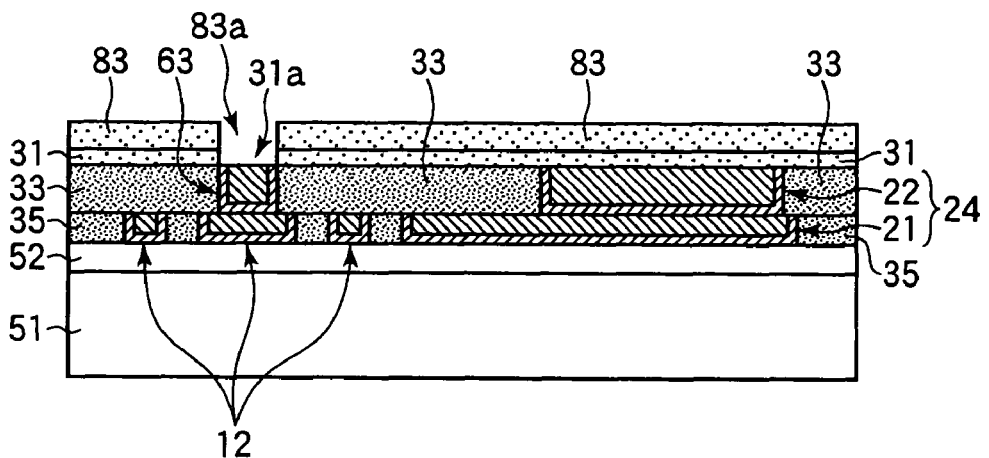
Figure 6C:
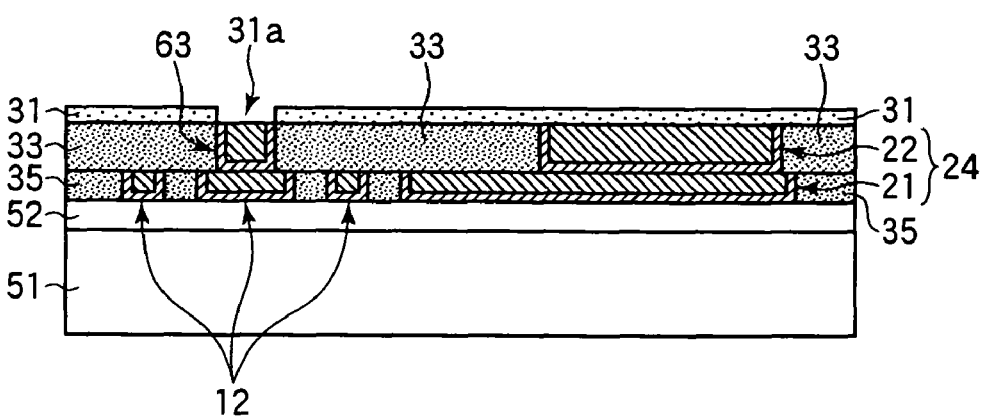

As shown in FIG. 6B, the dielectric film 31 exposed at the opening 83*a* is then removed by ashing to form the dielectric film 31 with a via opening 31*a* at which the conductor 63 is exposed. As occasion demands, the dielectric film 31 may be simultaneously removed at wafer cutting lines (chip cutting surfaces) which will be described later. When the dielectric film 31 is thus divided into pieces, film stress of the dielectric film 31 can be distributed. Next, as shown in FIG. 6C, the photosensitive resin layer 83 is peeled off.

Figure 7:
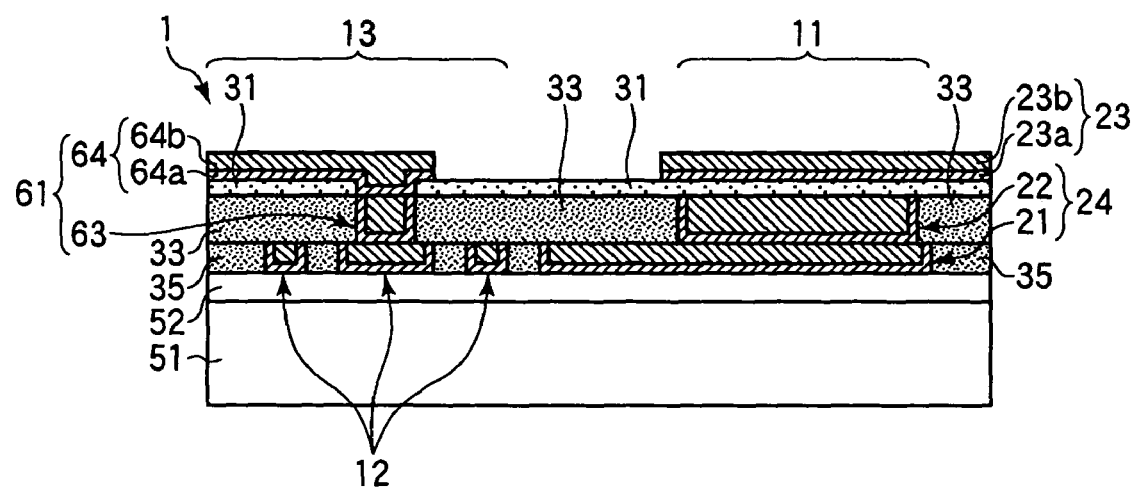
FIG. 7 is a sectional view showing the method of manufacturing the electronic component 1 according to the first embodiment of the invention.

Next, as shown in FIG. 7, a top conductor 23 and a conductor 64 are formed using the same method as used for the bottom conductor 21 and the coil conductor 12. More specifically, a photosensitive resin layer is formed by applying a photosensitive resin throughout the surface to a thickness of about 8 µm using, for example, a spin coat process, although not shown. Next, the photosensitive resin layer is then exposed and developed to form openings identical in shape to the top conductor 23 and the conductor 64 in the photosensitive resin layer. A layer of Ti having a thickness of about 30 nm and a layer of Cu having a thickness of about 100 nm are formed in the order listed on the entire surface using, for example, a sputtering process, thereby forming an underlying conductor.

A conductor made of Cu having a thickness in the range from 9 to 10 µm is then formed on the underlying conductor using an electroplating process. The entire surface is then polished using a CMP process until the photosensitive resin layer is exposed to form conductor patterns. Thus, a top conductor 23 and a conductor 64 having a thickness of about 8 µm are formed. The top conductor 23 is constituted by an underlying conductor 23*a* and a conductor 23*b* formed on the underlying conductor 23*a*. The conductor 64 is constituted by an underlying conductor 64*a* and a conductor 64*b* formed on the underlying conductor 64*a*. Next, the photosensitive resin layer is peeled off.

As a result, a lead-out conductor 61 constituted by the conductors 63 and 64 is formed. Through the above-described steps, a capacitor element (capacity element) 11 constituted by the raised conductor 22, the dielectric film 31, and the top conductor 23 is formed. At the same time, an inductor element (circuit element) 13 constituted by the coil conductor 12 and the lead-out conductor 61 is formed. A protective film is then formed throughout the surface as occasion demands.

Next, the wafer is cut along predetermined cutting lines to divide a plurality of the electronic components 1 formed on the wafer into each element forming region in the form of a chip. Although not shown, an external electrode electrically connected to each of the top conductor 23 and the lead-out conductor 61 exposed on a cut surface is then formed on the cut surface. Then, corners of each chip are chamfered as occasion demands to complete an electronic component 1.

According to the method of manufacturing the electronic component 1 of the present embodiment, the bottom conductor 21 of the capacitor element 11 and the coil conductor 12 are simultaneously formed at the same step. The raised conductor 22 and the conductor 63 are simultaneously formed at the same step. The top conductor 23 and the conductor 64 are simultaneously formed at the same step. Therefore, a reduction in the number of manufacturing steps can be achieved, and the electronic component 1 can be manufactured at a low cost.

Electronic components according to modifications of the present embodiment will now be described with reference to FIGS. 8A to 11B. In the following description, elements having the same functions and operations as those in the first embodiment are indicated by like reference numerals and will not be described in detail.

(Modification 1)

Figure 8A:
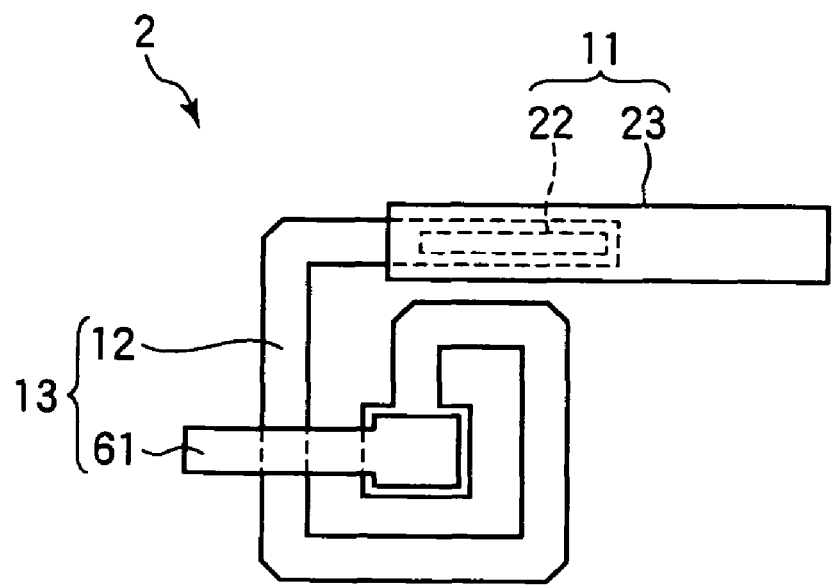
FIGS. 8A and 8B illustrate a modification of the electronic component 1 according to the first embodiment of the invention.
Figure 8B:
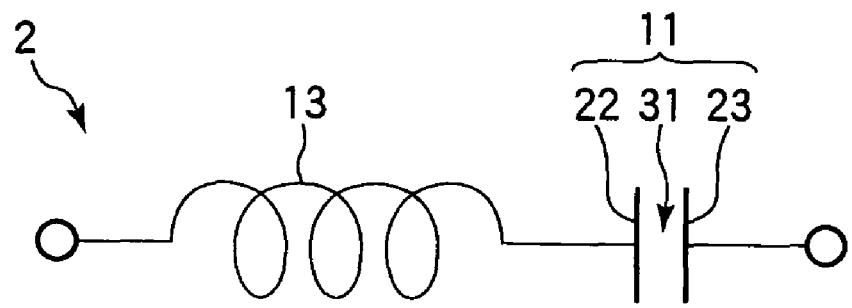

An electronic component 2 according to Modification 1 of the present embodiment will be first described with reference to FIGS. 8A and 8B. FIG. 8A is a plan view of the electronic component 2 of the present modification showing only conductors, and FIG. 8B shows an equivalent circuit of the electronic component 2. As shown in FIG. 8A, in the electronic component 2, a raised conductor 22 is formed on an outer end of a coil conductor 12 having a spiral shape. As shown in FIG. 8B, a capacitor element 11 and an inductor element 13 are connected in series to form a series resonance circuit. Each of a lead-out conductor 61 and a top conductor 23 serves as a terminal for energization.

(Modification 2)

Figure 9A:
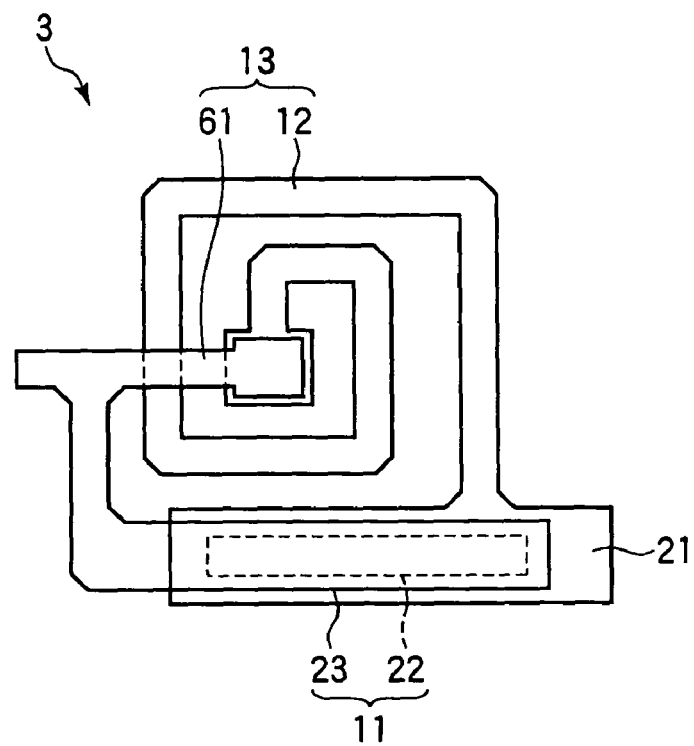
FIGS. 9A and 9B illustrate another modification of the electronic component 1 according to the first embodiment of the invention.
Figure 9B:
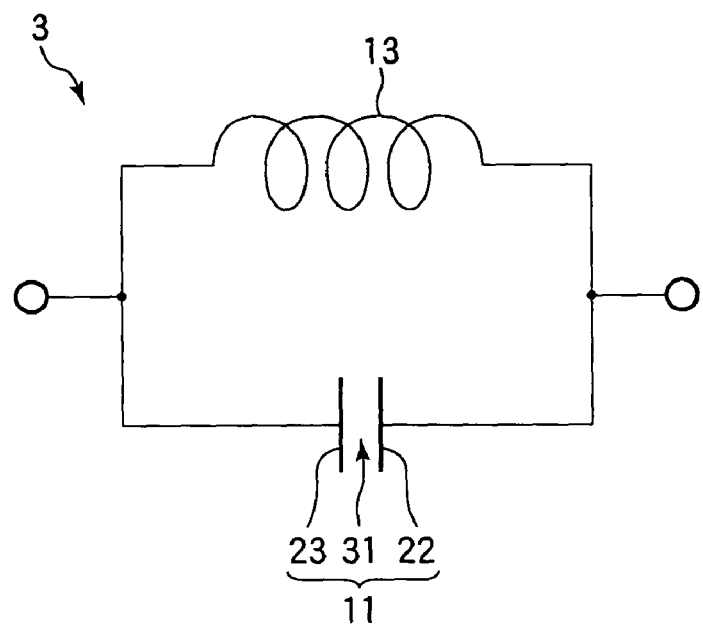

An electronic component 3 according to Modification 2 of the present embodiment will be described with reference to FIGS. 9A and 9B. FIG. 9A is a plan view of the electronic component 3 of the present modification showing only conductors, and FIG. 9B is an equivalent circuit diagram of the electronic component 3. As shown in FIG. 9A, an inductor element 13 includes a coil conductor 12 having a spiral shape and a rectangular lead-out conductor 61 connected to an inner end of the coil conductor 12 and extending in the horizontal direction of the figure. The electronic component 3 includes a rectangular bottom conductor 21 formed integrally with the coil conductor 12, connected to an outer end of the coil conductor 12, and extending in the horizontal direction of the figure. A capacitor element 11 includes a raised conductor 22 formed on the bottom conductor 21 and an L-shaped top conductor 23 formed integrally with the lead-out conductor 61 and provided above the raised conductor 22 in a face-to-face relationship with the same. As shown in FIG. 9B, the capacitor element 11 and the inductor element 13 are connected in parallel to form a parallel resonance circuit. The top conductor 23 is electrically connected to the lead-out conductor 61. Each of the lead-out conductor 61 and the bottom conductor 21 serves as a terminal for energization.

(Modification 3)

Figure 10A:
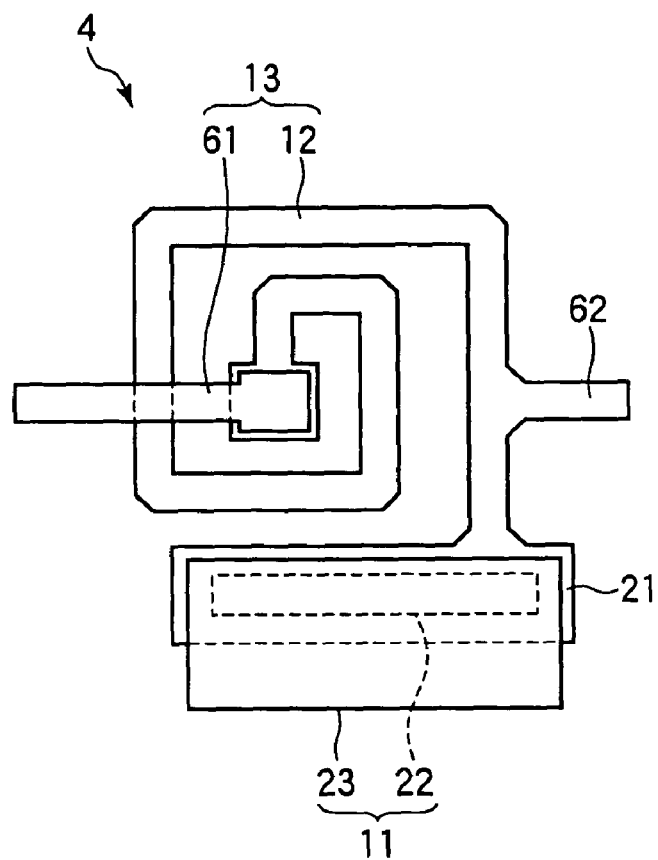
FIGS. 10A and 10B illustrate another modification of the electronic component 1 according to the first embodiment of the invention.
Figure 10B:
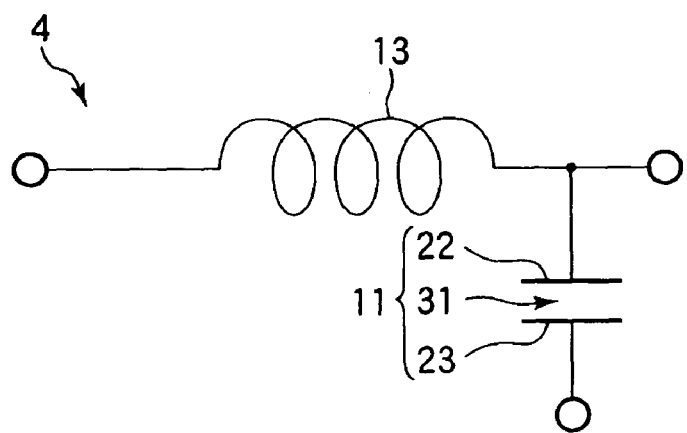

An electronic component 4 according to Modification 3 of the present embodiment will be described with reference to FIGS. 10A and 10B. FIG. 10A is a plan view of the electronic component 4 of the present modification showing only conductors, and FIG. 10B is an equivalent circuit diagram of the electronic component 4. As shown in FIG. 10A, an inductor element 13 includes a coil conductor 12 having a spiral shape and a rectangular lead-out conductor 61 connected to an inner end of the coil conductor 12 and extending in the horizontal direction of the figure. The electronic component 4 includes a rectangular bottom conductor 21 formed integrally with the coil conductor 12, connected to an outer end of the coil conductor 12, and extending in the horizontal direction of the figure. A capacitor element 11 includes a raised conductor 22 formed on the bottom conductor 21 and a rectangular top conductor 23 provided above the raised conductor 22 in a face-to-face relationship with the same. As shown in FIG. 10B, the inductor element 13 and the capacitor element 11 form a low-pass filter. The lead-out conductor 61 serves as a terminal on an input side. A lead-out conductor 62 which is led out in the neighborhood of the outer end of the coil conductor 12 serves as a terminal on an output side. The top conductor 23 serves as a terminal for ground connection.

(Modification 4)

Figure 11A:
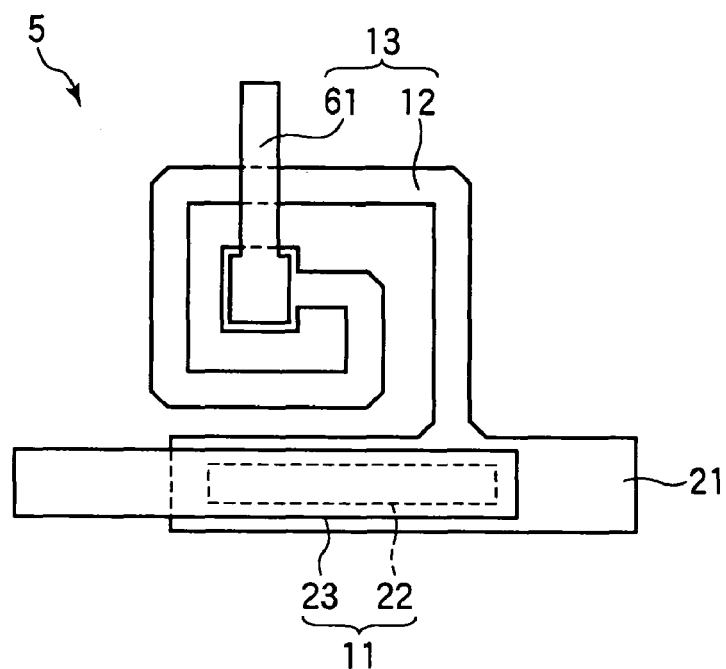
FIGS. 11A and 11B illustrate another modification of the electronic component 1 according to the first embodiment of the invention.
Figure 11B:
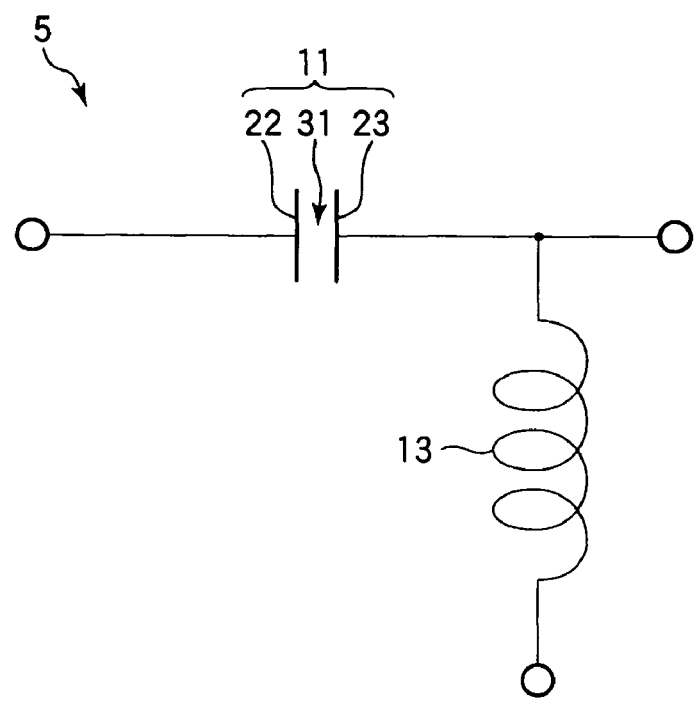

An electronic component 5 according to Modification 4 of the present embodiment will be described with reference to FIGS. 11A and 11B. FIG. 11A is a plan view of the electronic component 5 of the present modification showing only conductors, and FIG. 11B is an equivalent circuit diagram of the electronic component 5. As shown in FIG. 11A, an inductor element 13 includes a coil conductor 12 having a spiral shape and a rectangular lead-out conductor 61 connected to an inner end of the coil conductor 12 and extending in the vertical direction of the figure. The electronic component 5 includes a rectangular bottom conductor 21 formed integrally with the coil conductor 12, connected to an outer end of the coil conductor 12, and extending in the horizontal direction of the figure. A capacitor element 11 includes a raised conductor 22 formed on the bottom conductor 21 and a rectangular top conductor 23 provided above the raised conductor 22 in a face-to-face relationship with the same. As shown in FIG. 11B, the inductor element 13 and the capacitor element 11 form a high-pass filter. The top conductor 23 serves as a terminal on an input side, and the bottom conductor 21 serves as a terminal on an output side. The lead-out conductor 61 serves as a terminal for ground connection.

(Modification 5)

Figure 12A:
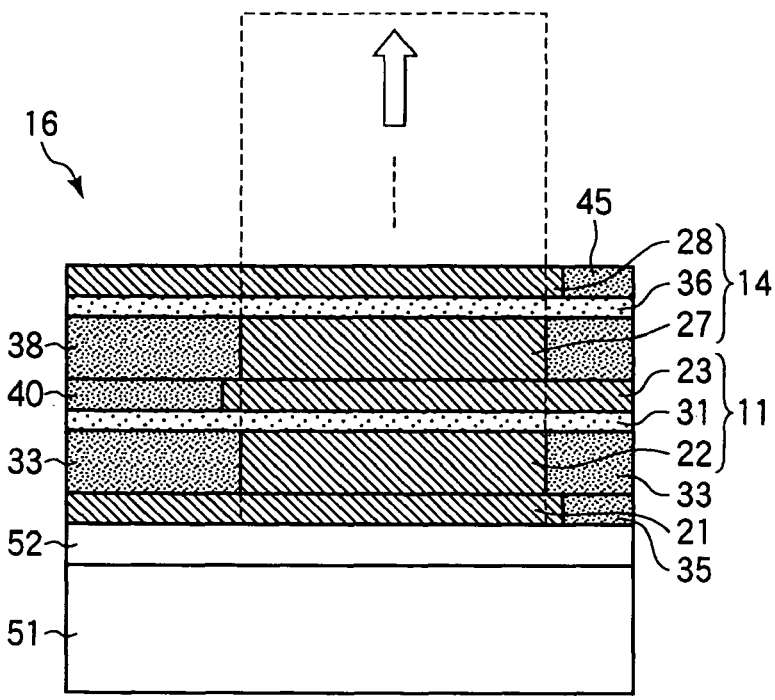
FIGS. 12A and 12B illustrate another modification and an example for comparison of the electronic component 1 according to the first embodiment of the invention.
Figure 12B:
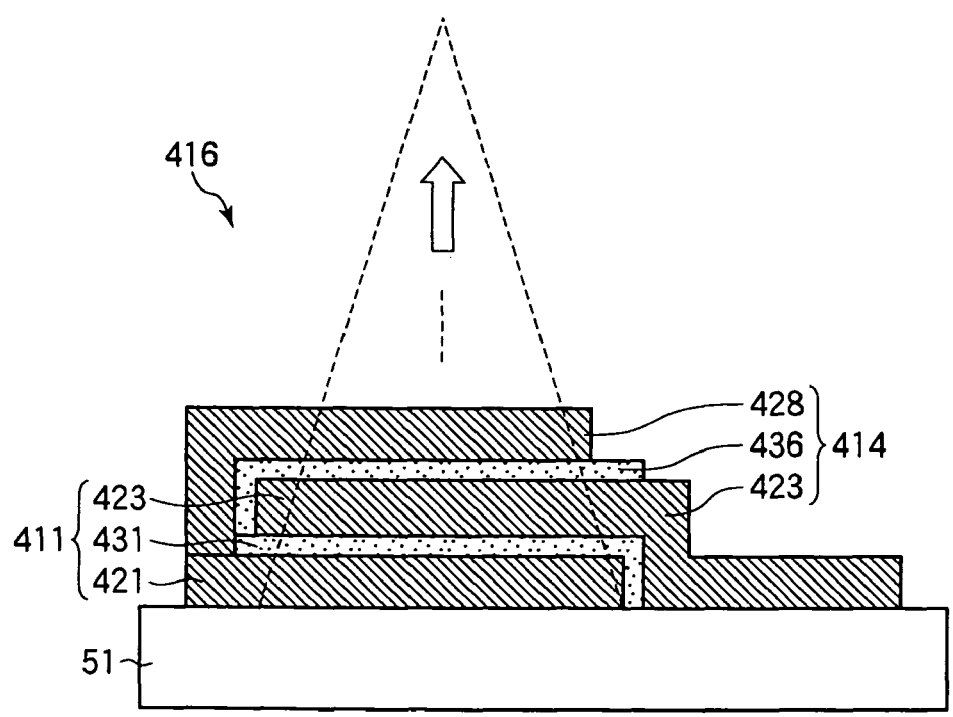

A multi-layer capacitor element according to Modification 5 of the present embodiment will now be described with reference to FIGS. 12A and 12B. FIG. 12A is a sectional view of a multi-layer capacitor element 16 according to the present modification. FIG. 12B is a sectional view of a multi-layer capacitor element 416 according to the related art as an example for comparison with the multi-layer capacitor element 16.

As shown in FIG. 12A, the multi-layer capacitor element 16 includes a capacitor element 11 as shown in FIGS. 1A to 1C and a capacitor element 14 formed on the capacitor element 11. The capacitor element 14 is constituted by a raised conductor 27 formed on a top conductor 23, a dielectric film 36, and a top conductor 28.

An insulation film 40 is formed in the same layer where the top conductor 23 of the capacitor element 11 resides. The insulation film 40 is formed from the same material and using the same method as the insulation film 35. The thickness of the insulation film 40 is substantially equal to the thickness of the top conductor 23, and the top conductor 23 and the insulation film 40 are formed with a smooth surface.

The raised conductor 27 of the capacitor element 14 is formed from the same material, using the same method, and in the same shape as the raised conductor 22. The raised conductor 27 is formed in positional correspondence with the raised conductor 22 when viewed in the normal direction of the substrate surface of the substrate 51. An insulation film 38 is formed in the same layer where the raised conductor 27 resides. The insulation film 38 is formed from the same material and using the same method as the insulation film 33. The thickness of the insulation film 38 is substantially equal to the thickness of the raised conductor 27, and the raised conductor 27 and the insulation film 38 are formed with a smooth surface.

A dielectric film 36 is formed on the raised conductor 27 and the insulation film 38. The dielectric film 36 is formed from the same material, using the same method, and in the same shape as the dielectric film 31. A top conductor 28 is formed on the dielectric film 36. The top conductor 28 is formed from the same material, using the same method, and in the same shape as the top conductor 23. The top conductor 28 is formed in positional correspondence with the bottom conductor 21 when viewed in the normal direction of the substrate surface of the substrate 51, and it is formed to cover the raised conductor 27 entirely. The top conductor 28 is electrically connected to the bottom conductor 21 by, for example, an external electrode (not shown) formed on a side of the multi-layer capacitor element 16. The capacitor elements 11 and 14 are thus connected in parallel.

An insulation film 45 is formed in the same layer where the top conductor 28 resides. The insulation film 45 is formed from the same material and using the same method as the insulation film 35. The thickness of the insulation film 45 is substantially equal to the thickness of the top conductor 28, and the top conductor 28 and the insulation film 45 are formed with a smooth surface.

The area over which the top conductor 28 and the raised conductor 27 face each other (the electrode area of the capacitor element 14) is equal to the electrode area of the capacitor element 11, and the dielectric constant and thickness of the dielectric film 36 are equal to the dielectric constant and thickness of the dielectric film 31. Therefore, the capacity value of the capacitor element 14 is equal to the capacity value of the capacitor element 11. Since the capacitor elements 11 and 14 are connected in parallel, the multi-layer capacitor element 16 has a capacity value that is substantially twice the capacity of the capacitor element 11.

Figure 20B:
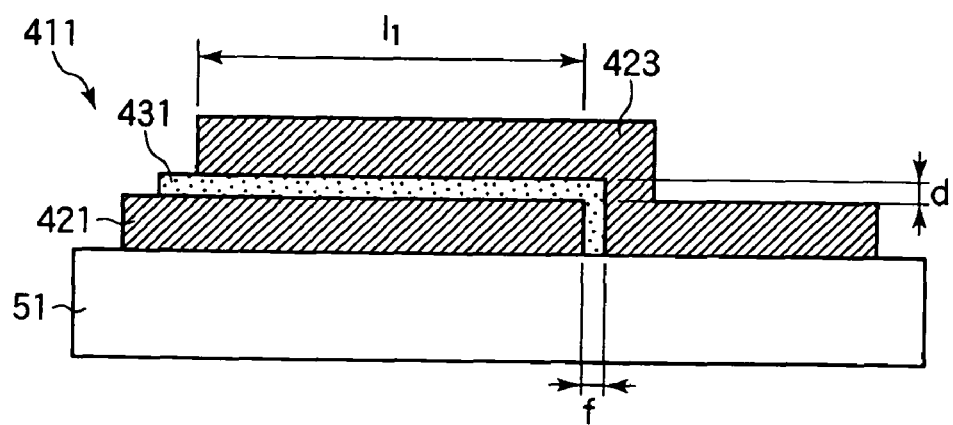

As shown in FIG. 12B, the multi-layer capacitor element 416 includes a capacitor element 411 as shown in FIG. 20B and a capacitor element 414 formed on the capacitor element 411. The capacitor element 411 is constituted by a bottom conductor 421, a dielectric film 431 formed on the bottom conductor 421, and a top conductor 423 which is used also as a bottom conductor of the capacitor element 414. The capacitor element 414 is constituted by the top conductor 423 and a dielectric film 436 and a top conductor 428 formed on the top conductor 423.

The bottom conductor 421 is formed on the substrate 51. The dielectric film 431 is formed on side and top surfaces of the bottom conductor 421. The top conductor 423 is formed on the dielectric film 431 and in the same layer where the bottom conductor 421 resides. The top conductor 423 is formed so as to avoid edges of the bottom conductor 421. Therefore, the top conductor 423 formed on the bottom conductor 421 is smaller than the bottom conductor 421.

The dielectric film 436 is formed on side and top surfaces of the top conductor 423. The dielectric film 436 is formed from the same material and using the same method as the dielectric film 431. The top conductor 428 is formed on the dielectric film 436 and the bottom conductor 421. The top conductor 428 is formed from the same material and using the same method as the bottom conductor 421. The top conductor 428 is formed so as to avoid edges of the top conductor 423. Therefore, the top conductor 428 formed on the top conductor 423 is smaller than the top conductor 423. The top conductor 428 is electrically connected to the bottom conductor 421. Thus, the capacitor elements 411 and 414 are connected in parallel.

In the case of the multi-layer capacitor element 416, attention must be paid to the prevention of shorting between the top conductor 423 and the bottom conductor 421, the accuracy of the relative position and area of the bottom conductor 421 and the top conductor 423. Therefore, in the multi-layer capacitor element 416, the top conductor 423 is formed so as to avoid edges of the bottom conductor 421, and the top conductor 428 is formed so as to avoid edges of the top conductor 423. Thus, the electrode area of the capacitor element 414 constituted by the top conductor 423, the dielectric film 436, and the top conductor 428 is smaller than the electrode area of the capacitor element 411. As indicated by the triangular outline in a broken line in the figure, when a plurality of capacitor elements are stacked on the capacitor element 411 according to the related art, a capacitor element has a smaller electrode area, the higher the capacitor element is located. Therefore, the capacity of the multi-layer capacitor element is unlikely to increase even when a plurality of capacitor elements are stacked as indicated by the thick arrow in the figure.

On the contrary, in the present embodiment, the top conductor 23 can be formed on the dielectric film 31 even at edges of the raised conductor 22, and the top conductor 23 can therefore be formed greater than the raised conductor 22 when viewed in the normal direction of the substrate 51. Thus, the area of the raised conductor 27 formed on the top conductor 23 can be made equal to the area of the raised conductor 22. It is therefore possible to make the electrode area of the capacitor element 14 formed on the capacitor element 11 equal to the electrode area of the capacitor element 11.

As indicated by the rectangular outline in a broken line in the figure, in the multi-layer capacitor element including a plurality of capacitor elements formed one over another, the capacitor elements can be provided with equal electrode areas. Therefore, a multi-layer capacitor element having a great capacity can be obtained by staking a plurality of capacitor elements on the capacitor element 14 as indicated by the thick arrow in the figure.

The area of the raised conductor 27 formed on the top conductor 23 can be made greater than the area of the raised conductor 22, and the electrode area of the capacitor element 14 formed on the capacitor element 11 can be also made greater than the electrode area of the capacitor element 11. As thus described, in a multi-layer capacitor element including a plurality of capacitor elements formed one over another, the electrode area of each capacitor element can be made greater than that of the capacitor element underlying the same. It is therefore possible to provide a multi-layer capacitor element having a greater capacity by staking a plurality of capacitor elements on the capacitor element 14. In the multi-layer capacitor element including a plurality of capacitor elements formed one over another, the electrode area of the capacitor element in each layer can be freely laid out.

In the case of the multi-layer capacitor element 416 according to the related art, each layer has a facing area (electrode area) smaller than the layer underlying the same, and the number of layers must be increased to obtain a high capacity as desired. On the contrary, the number of layers of the multi-layer capacitor element 16 of the present modification can be made smaller because the facing area (electrode area) does not decrease each time a layer is formed. More attention can therefore be paid to the cost, ESR, parasitic inductance, shorting failures, and power endurance, and electrostatic breakdown. It is therefore possible to obtain a low-cost and reliable multi-layer capacitor element 16 which is compact and which can be used at high frequencies.

The top conductor constituting the uppermost layer of the multi-layer capacitor 16 may be formed smaller than the region of the bottom conductor. In the multi-layer capacitor element 16 of the present modification, the size of the top conductor constituting the uppermost layer can be freely designed when the top conductor is an electrode having a terminal structure to be used as a pad for external connection or to be used for forming a bump. Obviously, a capacitor element having such dimensions and such a position may be used in an intermediate layer. As a result, a capacitor having a different capacity value can be provided in each layer, which allows reduction of parasitic inductance by drawing wiring and space saving. It is therefore possible to make an electronic component 1 having a multi-layer capacitor element 16 compact, to allow the component to be used at high frequencies, and to improve the performance of the same.

Second Embodiment

Figure 13:
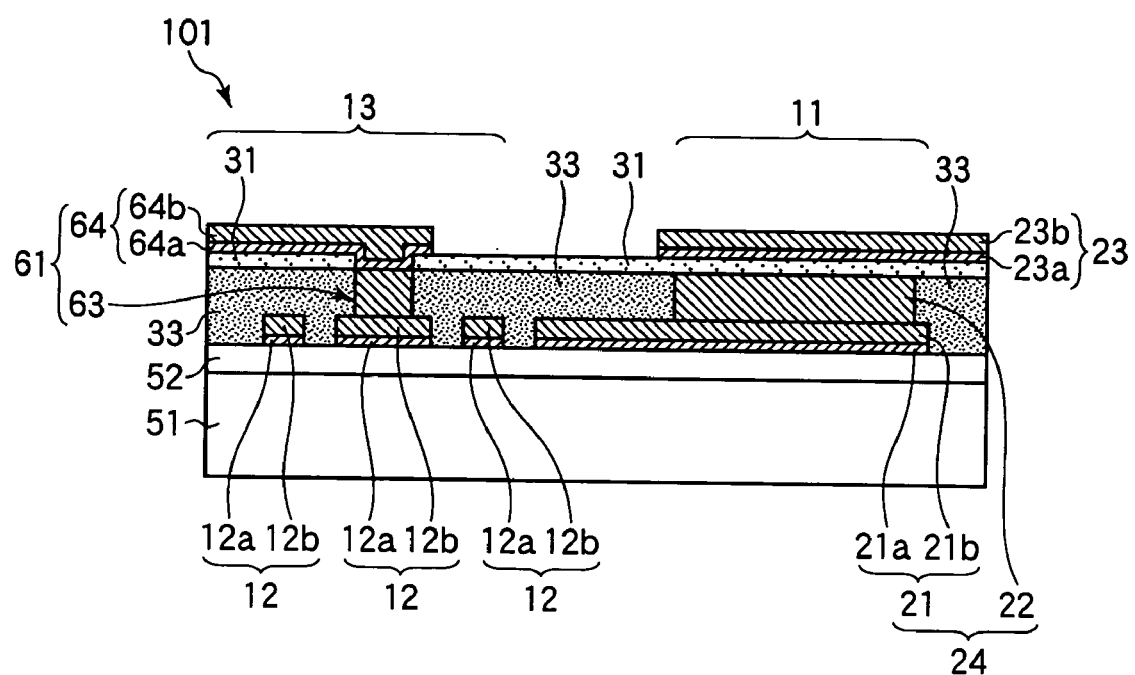
FIG. 13 is a sectional view of an electronic component 101 according to a second embodiment of the invention.

An electronic component according to a second embodiment of the invention will now be described with reference to FIGS. 13 to 18C. First, an electronic component 101 according to the present embodiment will be described with reference to FIG. 13. FIG. 13 is a sectional view of the electronic component 101 of the present embodiment.

The electronic component 101 of the present embodiment is characterized in that an insulation film 33 is formed also around a bottom conductor 21 and a coil conductor 12 and at a gap between the conductors to constitute only one layer. The component is also characterized in that the coil conductor 12, the bottom conductor 21, a raised conductor 22, a top conductor 23, and a lead-out conductor 61 are formed using a semi-additive process.

The coil conductor 12 includes a Ti/Cu underlying conductor 12a formed on a planarized layer 52 of a substrate 51 and a Cu conductor 12b formed on the underlying conductor 12a. The bottom conductor 21 includes a titanium (Ti)/copper (Cu) underlying conductor 21a formed on the planarized layer 52 of the substrate 51 and a Cu conductor 21b formed on the underlying conductor 21a. The raised conductor 22 and a conductor 63 is formed in one layer. The configuration of the electronic component 101 will not be described further because it is the same as that of the electronic component 1 except that the insulation film 33 is formed also around the bottom conductor 21 and the coil conductor 12 and at the gap between the conductors to constitute only one layer and except the configuration of the conductors 12, 21, 22, and 63.

A dielectric film 31 of the electronic component 101 of the present embodiment is formed on a planer surface. Therefore, even when the dielectric film 31 is formed with a small thickness, the thickness of the dielectric film 31 can be made uniform even at edges of the raised conductor 22. As a result, shorting can be prevented between the raised conductor 22 and the top conductor 23. The breakdown limit value of the withstand voltage and the insulating properties of the electronic component 101 are thus improved, and variation of the quality of the electronic component 101 is suppressed between products thus manufactured. The electronic component 101 can provide the same advantages as those of the electronic component 1 of the first embodiment.

A method of manufacturing an electronic component 101 according to the present embodiment will now be described with reference to FIGS. 14A to 18C. A multiplicity of electronic components 101 are simultaneously formed on a wafer, and FIGS. 14A to 18C show an element forming region of one of the electronic components 101. FIGS. 14A to 18C are sectional views of the electronic component 101 of the present embodiment showing steps of manufacturing the same.

In the present embodiment, a substrate 51 having a planarized surface is used. First, an entire surface of the substrate 51 which is formed from alumina ($Al_2O_3$) is polished using a CMP (chemical mechanical polishing) process to form a planarized layer 52.

Figure 14A:
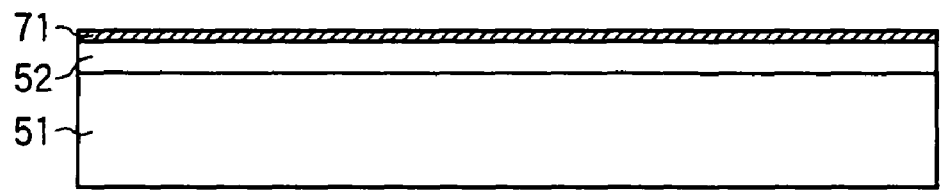
FIGS. 14A, 14B, and 14C are sectional views showing a method of manufacturing the electronic component 101 according to the second embodiment of the invention.
Figure 14B:
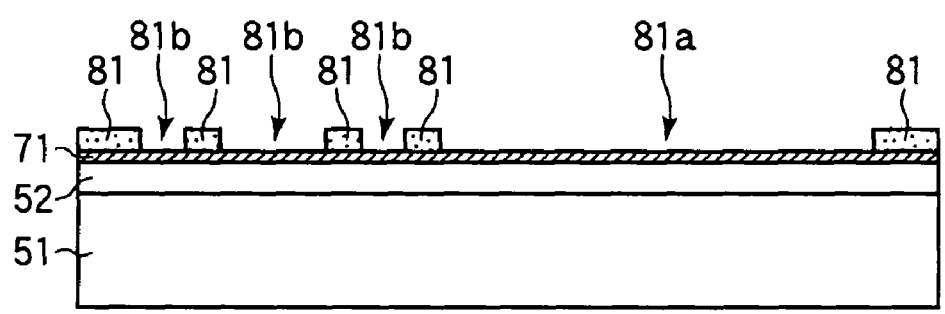

Next, as shown in FIG. 14A, an underlying conductor 71 is formed by stacking a film of titanium (Ti) having a thickness of about 30 nm and a film of copper (Cu) having a thickness of about 100 nm in the order listed on the planarized layer 52 of the substrate 51 using, for example, a sputtering process. Next, a photosensitive resin is applied to the entire surface of the underlying conductor 71 to a thickness of about 8 μm using, for example, a spin coat process to form a photosensitive resin layer 81. Next, as shown in FIG. 14B, the photosensitive resin layer 81 is exposed and developed to form the photosensitive resin layer 81 with an opening 81*a* and an opening 81*b* which have a rectangular shape and a spiral shape, respectively, when viewed in the normal direction of the substrate 51. An outer end of the opening 81*b* is connected to the opening 81*a*.

Figure 14C:
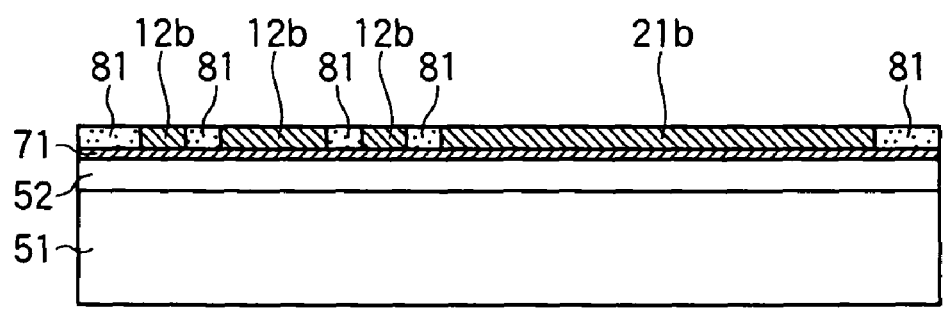

Next, as shown in FIG. 14C, a conductor made of Cu is formed to a thickness of about 8 μm on the underlying conductor 71 in the openings 81*a* and 81*b* using an electroplating process to provide conductors 12*b* and 21*b*.

Figure 15A:
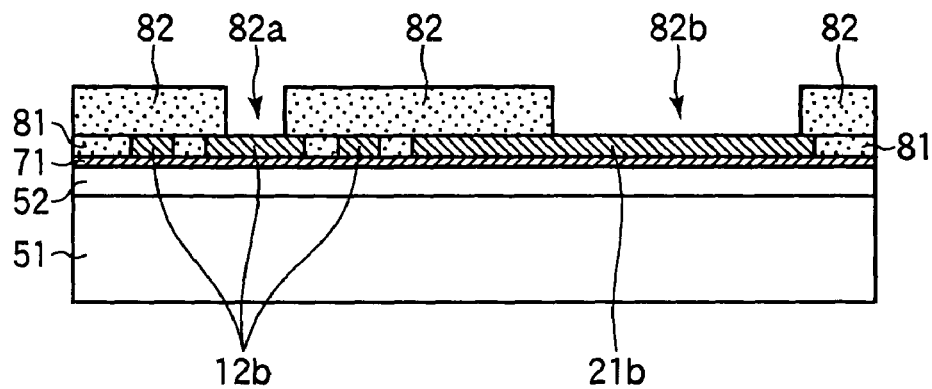
FIGS. 15A, 15B, and 15C are sectional views showing the method of manufacturing the electronic component 101 according to the second embodiment of the invention.

A photosensitive resin is then applied to the entire surface to a thickness of about 8 μm using, for example, a spin coat process to form a photosensitive resin layer 82. Next, as shown in FIG. 15A, the photosensitive resin layer 82 is exposed and developed to form the photosensitive resin layer 82 with an opening 82*a* at which an inner end of the conductor 12*b* is exposed. At the same time, the photosensitive resin layer 82 is formed with an opening 82*b* at which part of the conductor 21*b* is exposed.

Figure 15B:
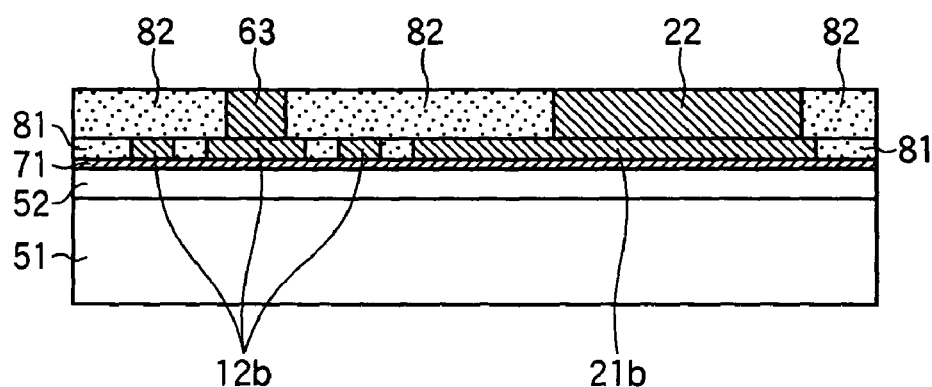
Figure 15C:
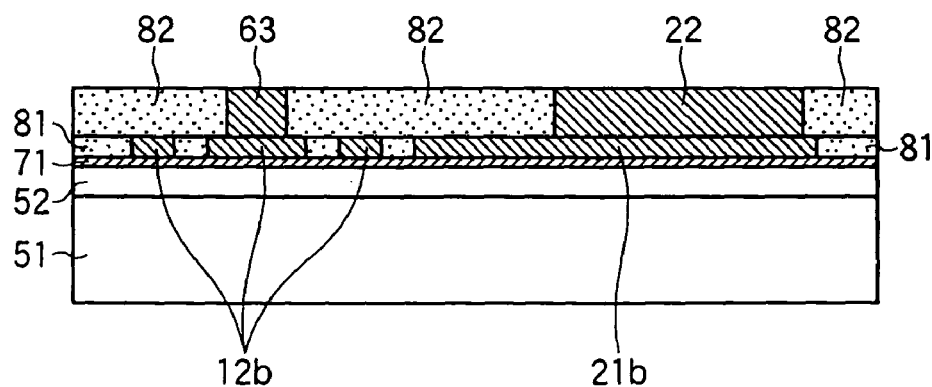
Figure 16A:
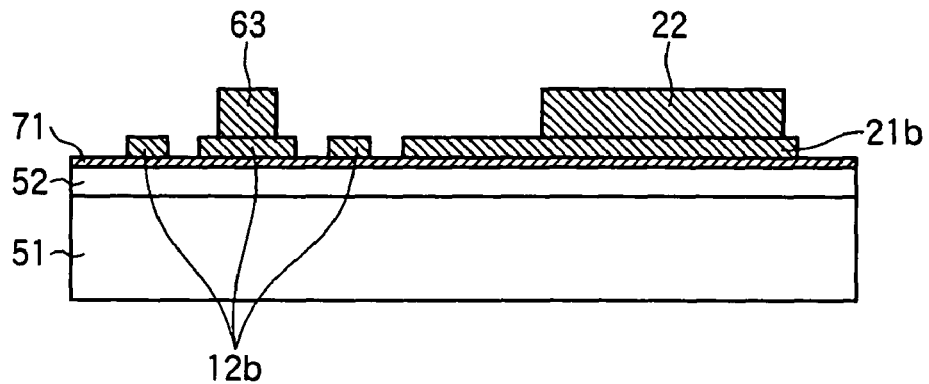
FIGS. 16A, 16B, and 16C are sectional views showing the method of manufacturing the electronic component 101 according to the second embodiment of the invention.

Next, as shown in FIG. 15B, a Cu conductor 63 having a thickness of 9 to 10 μm is formed in the opening 82*a* using an electroplating process, and a raised conductor 22 having the same thickness and made of the same material is formed in the opening 82*b* at the same time. Next, as shown in FIG. 15C, the entire surface is polished using a CMP process until the thickness of the raised conductor 22 and the conductor 63 becomes about 8 μm. Next, as shown in FIG. 16A, the photosensitive resin layers 81 and 82 are peeled off.

Figure 16B:
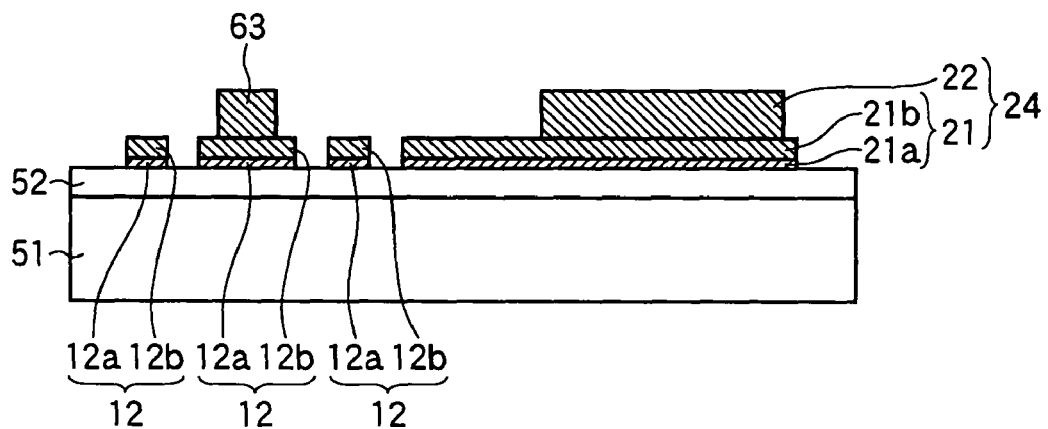

As shown in FIG. 16B, dry etching or wet etching is then performed to remove the underlying conductor 71 exposed between the conductors 12*b* and 21*b*, thereby forming an underlying conductor 21*a* constituted by the underlying conductor 71 under the conductor 21*b* and an underlying conductor 12*a* constituted by the underlying conductor 71 under the conductor 12*b*. Through the above-described steps, a bottom conductor 21 having a multi-layer structure is formed by stacking the underlying conductor 21*a* and the conductor 21*b*, and a coil conductor 12 having a multi-layer structure is formed by stacking the underlying conductor 12*a* and the conductor 12*b*. A first conductor 24 constituted by the bottom conductor 21 and the raised conductor 22 is also formed.

While the coil conductor 12, the bottom conductor 21, the raised conductor 22, and the conductor 63 of the present embodiment are formed using a semi-additive process (deposition process), the conductors may alternatively be formed using a damascene process, subtractive process (etching process) or lift-off process. A top conductor 23 and a conductor 64 which will be described later are formed using the same method as for the conductors 12, 21, 22, and 63.

Figure 16C:
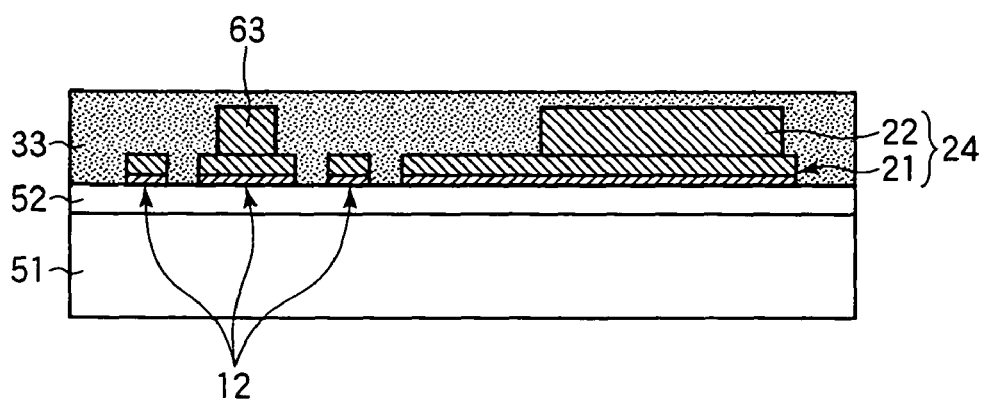
Figure 17A:
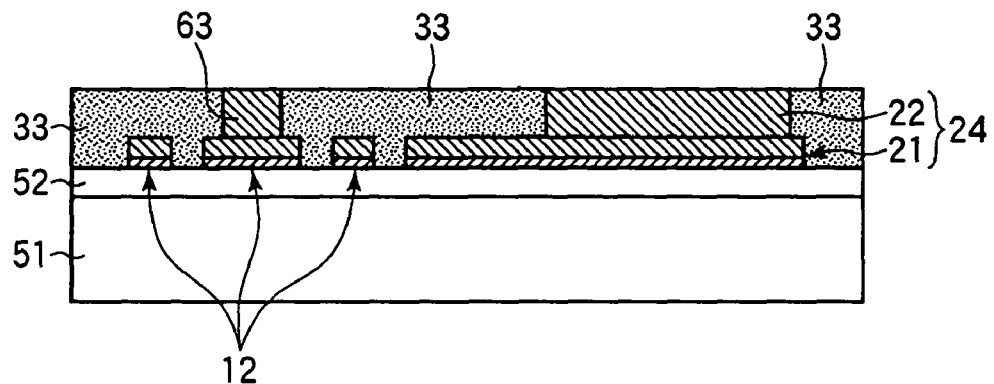
FIGS. 17A, 17B, and 17C are sectional views showing the method of manufacturing the electronic component 101 according to the second embodiment of the invention.

Next, as shown in FIG. 16C, a photosensitive resin such as polyimide is applied to the entire surface to form an insulation film 33 thereon. Post-baking is then performed on the insulation film 33. Next, as shown in FIG. 17A, the surface of the insulation film 33 is polished using a CMP process until the top surfaces of the raised conductor 22 and the conductor 63 are exposed. The raised conductor 22 and the conductor 63 are thus formed with a thickness of about 8 μm. The top surfaces of the raised conductor 22, the insulation film 33, and the conductor 63 are thus planarized.

Figure 17B:
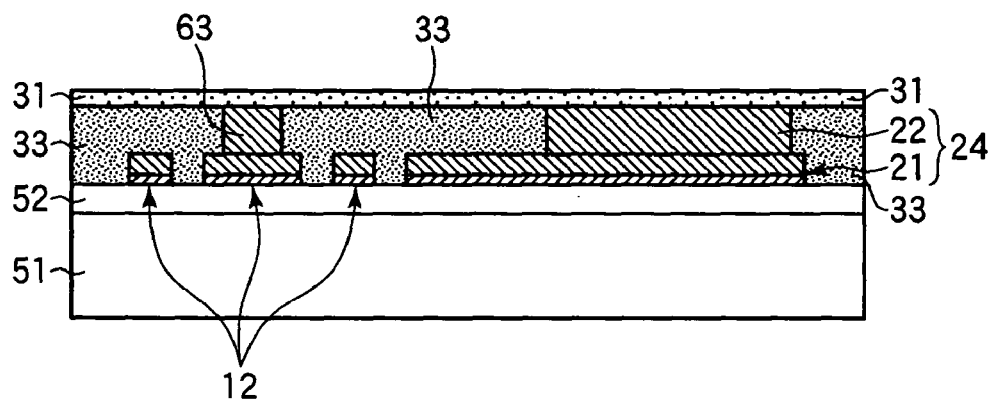

Next, as shown in FIG. 17B, a dielectric film 31 having a thickness of about 0.1 μm is formed throughout the surface. Referring to the material of the dielectric film 31, for example, alumina, silicon nitride ($Si_4N_3$), or silicon dioxide ($SiO_2$) is used. Since the top surfaces of the raised conductor 22, the insulation film 33, and the conductor 63 are planar, the dielectric film 31 is flatly formed.

Figure 17C:
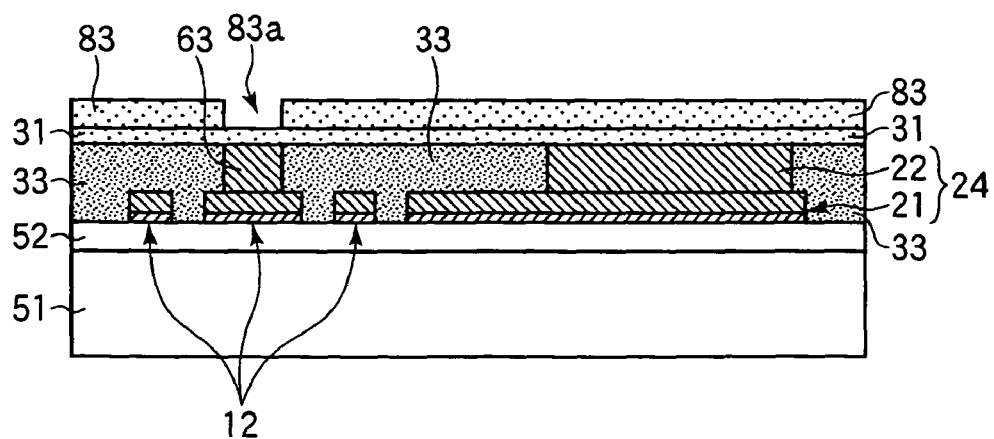

A photosensitive resin is then applied to the entire surface of the dielectric film 31 to form a photosensitive resin layer 83. Next, as shown in FIG. 17C, the photosensitive resin layer 83 is exposed and developed to form an opening 83*a* in the photosensitive resin layer 83 above the dielectric film 31 on the conductor 63. Post baking (a heating process) is then performed on the photosensitive resin layer 83.

Figure 18A:
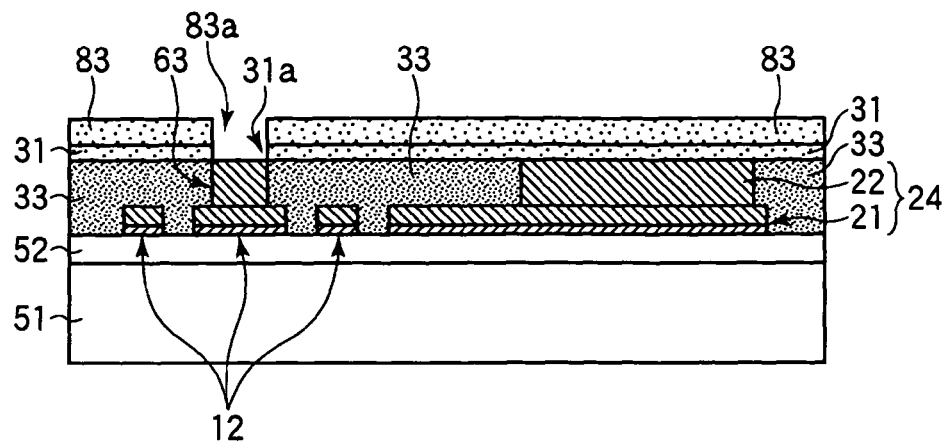
FIGS. 18A, 18B, and 18C are sectional views showing the method of manufacturing the electronic component 101 according to the second embodiment of the invention.
Figure 18B:
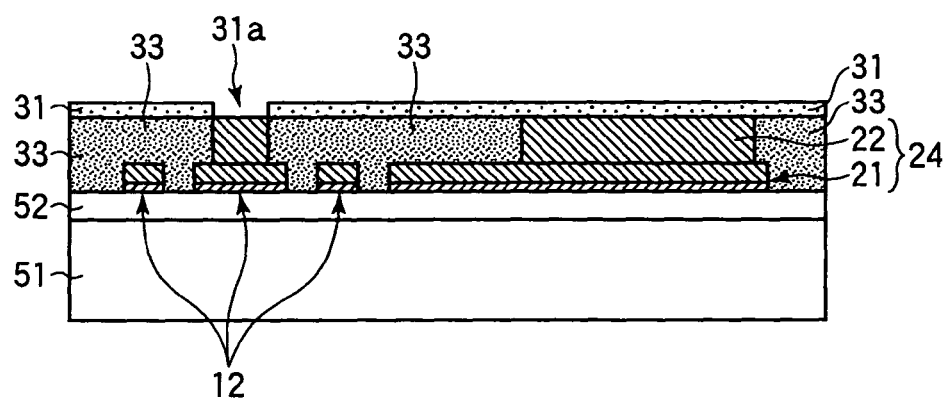

As shown in FIG. 18A, the dielectric film 31 exposed at the opening 83*a* is then removed by ashing to form the dielectric film 31 with a via opening 31*a* at which the conductor 63 is exposed. As occasion demands, the dielectric film 31 may be simultaneously removed at wafer cutting lines (chip cutting surfaces) which will be described later. When the dielectric film 31 is thus divided into pieces, film stress of the dielectric film 31 can be distributed. Next, the photosensitive resin layer 83 is peeled off as shown in FIG. 18B.

Figure 18C:
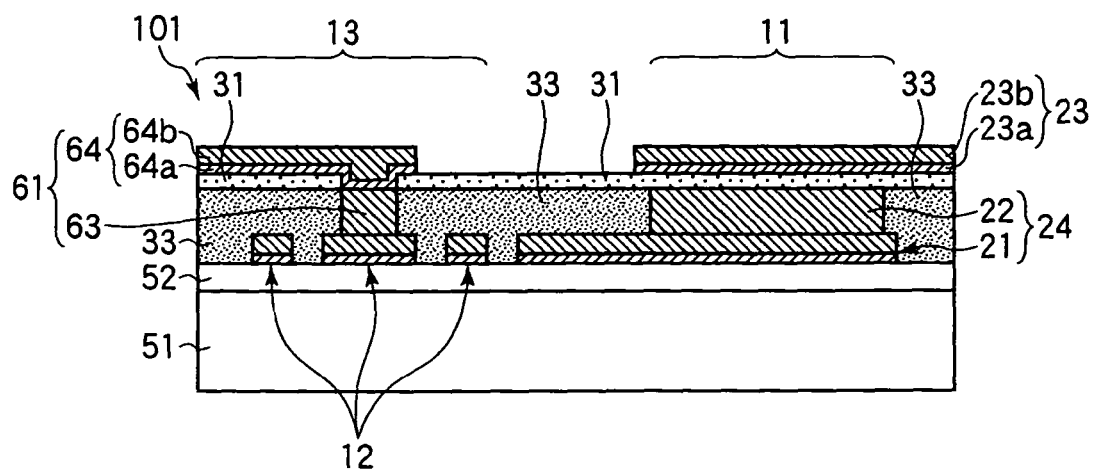

Next, as shown in FIG. 18C, a top conductor 23 and a conductor 64 are formed using the same method as used for the bottom conductor 21 and the coil conductor 12. More specifically, a film of Ti having a thickness of about 30 nm and a film of Cu having a thickness of about 100 nm are formed throughout the surface in the order listed using, for example, a sputtering process to form an underlying conductor, although not shown. Next, a photosensitive resin is applied to the entire surface of the underlying conductor to a thickness of about 8 μm using, for example, a spin coat process to form a photosensitive resin layer thereon.

The photosensitive resin layer is then exposed and developed to form openings identical in shape to the top conductor 23 and the conductor 64 in the photosensitive resin layer.

A conductor made of Cu having a thickness in the range from 9 to 10 μm is then formed on the underlying conductor exposed at the openings using an electroplating process. The surface of the conductor is then polished using a CMP process to form a conductor 23*b* and a conductor 64*b* having a thickness of about 8 μm. The photosensitive resin layer is then etched away.

Next, as shown in FIG. 18C, dry etching or wet etching is performed to remove the underlying conductor exposed around the conductors 23*b* and 64*b* and between the conductors 23*b* and 64*b*, thereby forming an underlying conductor 23*a* constituted by the underlying conductor under the conductor 23*b* and an underlying conductor 64*a* constituted by the underlying conductor under the conductor 64*b*. Thus, a top conductor 23 having a multi-layer structure is formed by stacking the underlying conductor 23*a* and the conductor 23*b*, and a conductor 64 having a multi-layer structure is formed by stacking the underlying conductor 64*a* and the conductor 64*b*.

A lead-out conductor 61 constituted by the conductors 63 and 64 are also formed. Through the above-described steps, a capacitor element (capacity element) 11 constituted by the raised conductor 22, the dielectric film 31, and the top conductor 23 is formed. At the same time, an inductor element (circuit element) 13 constituted by the coil conductor 12 and the lead-out conductor 61 is formed. A protective film is then formed throughout the surface as occasion demands.

Next, the wafer is cut along predetermined cutting lines to divide a plurality of the electronic components 101 formed on the wafer into each element forming region in the form of a chip. Although not shown, an external electrode electrically connected to each of the top conductor 23 and the lead-out conductor 61 exposed on a cut surface is then formed on the cut surface. Then, corners of each chip are chamfered as occasion demands to complete an electronic component 101.

According to the method of manufacturing the electronic component 101 of the present embodiment, the bottom conductor 21 and the coil conductor 12 of the capacitor element 11 are simultaneously formed at the same step. The raised conductor 22 and the conductor 63 are simultaneously formed at the same process. The top conductor 23 and the conductor 64 are simultaneously formed at the same step. Therefore, a reduction in the number of manufacturing steps can be achieved, and the electronic component 101 can be manufactured at a low cost.

Third Embodiment

Figure 19:
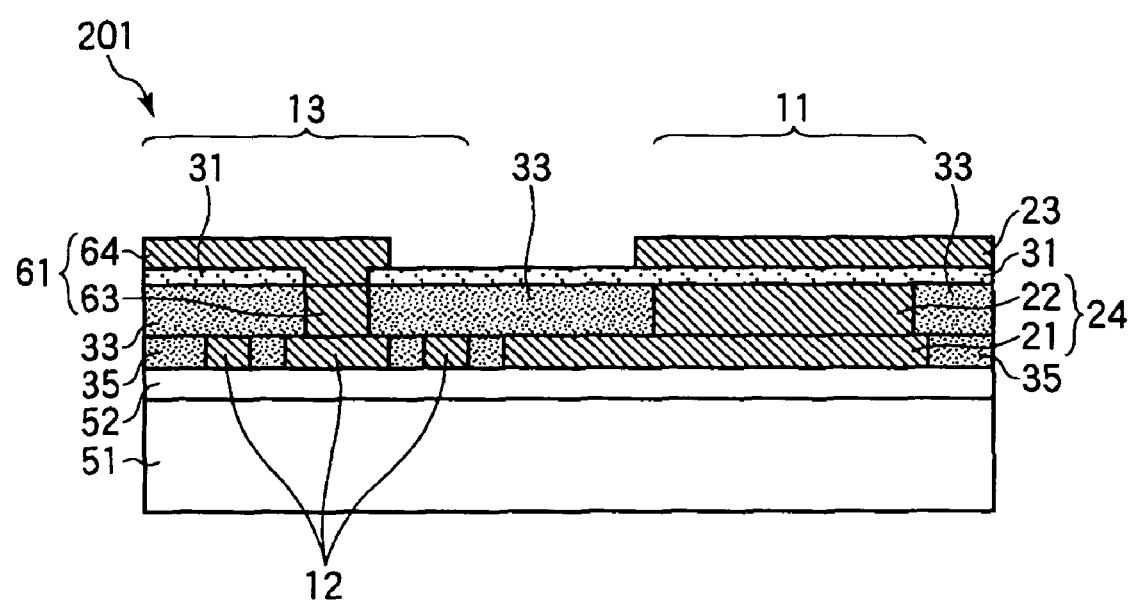
FIG. 19 is a sectional view of an electronic component 201 according to a third embodiment of the invention.

An electronic component according to a third embodiment of the invention will now be described with reference to FIG. 19. FIG. 19 is a sectional view of an electronic component 201 of the present embodiment.

The electronic component 201 of the present embodiment is characterized in that a coil conductor 12, a bottom conductor 21, a raised conductor 22, a top conductor 23, and a lead-out conductor 61 are formed using a pasting process. The coil conductor 12, the bottom conductor 21, the raised conductor 22, the top conductor 23, and the lead-out conductor 61 are formed as a single layer from a conductive resin or conductive paste including silver (Ag) or copper (Cu). The configuration of the electronic component 201 will not be further described because it is similar to that of the electronic component 1 of the first embodiment except that the conductors 12, 21, 22, 23, and 61 are formed using a pasting process in a single-layer structure. The electronic component 201 of the present embodiment provides the same advantages as those of the electronic component 1 of the first embodiment.

The invention is not limited to the above-described embodiments and may be modified in various ways.

While the above embodiments have addressed an electronic component including only a capacitor element 11 and an inductor element 13 by way of example, the invention is not limited to such components. For example, the invention may be applied to RC composite type electronic components including a resistive element formed instead of an inductor element 13. The invention may be applied also to RLC composite type electronic components including a resistive element in addition to a capacitor element 11 and an inductor element 13. The invention is not limited to electronic components including only passive elements and may be applied to electronic components including active elements such as a transistor and diode as long as the electronic components include a capacitor element 11. Further, the invention may be applied to digital-analog hybrid circuits as long as the electronic components include a capacitor element 11. Further, the invention may be used in a desired circuit that is a combination of a plurality of any of LCR elements to achieve a desired function. Obviously, the invention is not limited to concentrated constant elements and may be applied to a circuit configuration in which such elements are combined with a distributed constant circuit. Such components may be also combined with a semiconductor element.

The substrate 51 may be made of a semiconductor material or low temperature co-fired ceramics (LTCC). The electronic component 1 may be formed in a circuit substrate.

Although the first to third embodiments have been described by referring to an electronic component 1 including a capacitor element 11 constituted one layer by way of example, the invention is not limited to such a structure. For example, the invention may be applied to an electronic component 1 including a multi-layer type capacitor element 11 in which layers having a conductor and a dielectric film 31 are repeatedly stacked. When capacitor elements 11 including layers of dielectric films 31 stacked one over another are to be formed, capacitor elements 11 of the electronic components according to the first to third embodiments may be appropriately combined. For example, capacitor elements 11 according to the same embodiment may be repeatedly stacked. Alternatively, capacitor elements 11 according to one embodiment may be repeatedly stacked on a capacitor element 11 according to another embodiment. Further, capacitor elements according to two embodiments may be alternately stacked.

In the above-described embodiments, the raised conductor 22 is formed on the bottom conductor 21 which is a wiring layer. However, the invention is not limited to such a configuration. For example, the raised conductor 22 may alternatively formed on a pad.

Although the above embodiments have addressed the electronic component 1 including the first conductor 24 having a two-layer structure constituted by the bottom conductor 21 and the raised conductor 22 by way of example, the invention is not limited to such a structure. For example, the invention may be applied to an electronic component 1 including a first conductor 24 having a single-layer structure including a protrusion above a wiring layer.

The above embodiments have addressed the electronic component 1 in which the top conductor 23 is formed to entirely cover the raised conductor 22 when viewed in the normal direction of the substrate surface of the substrate 51 by way of example. However, the invention is not limited to such components. The invention may be applied to an electronic component 1 in which the top conductor 23 is formed to cover part of the raised conductor 22 when viewed in the normal direction of the substrate surface of the substrate 51.

Although the above embodiments have addressed the electronic component 1 in which each conductor has a rectangular sectional shape by way of example, each conductor may alternatively have a trapezoidal or inverse trapezoidal sectional shape.

Although the above embodiments have addressed the electronic component 1 in which the insulation film is formed from a photosensitive resin such as photosensitive polyimide by way of example, the insulation film may be a film obtained by sputtering alumina.

Although the above embodiments have addressed the electronic component 1 in which the raised conductor 22 and the insulation film 33 are formed with a smooth surface by way of example, this is not limiting the invention. It is not essential to form the raised conductor 22 and the insulation film 33 with a completely smooth surface as long as shorting between the raised conductor 22 and the top conductor 23 can be prevented. In this case, it is desirable that a height difference between the raised conductor 22 and the insulation film 33 is equal to or smaller than the thickness of the dielectric film 31 sandwiched between the first conductor 24 including the raised conductor 22 and the top conductor (second conductor) 23.

What is claimed is:

1. An electronic component comprising:
   a first conductor having a bottom conductor formed on a substrate and a raised conductor formed to protrude from the bottom conductor;
   a dielectric film stacked on the raised conductor;
   a second conductor stacked on the dielectric film to constitute a capacity element in combination with the raised conductor and the dielectric film;
   a coil conductor having an end electrically connected to an end of the bottom conductor; and
   a lead-out conductor which is in contact with another end of the coil conductor at a via opening that is formed in the dielectric film, wherein the dielectric film constituting the capacity element is made of a same material as the dielectric film having the via opening,
   wherein the bottom conductor is a conductive layer having a major surface;
   the raised conductor is a thin plate also having a major surface; and
   the major surface of the raised conductor is parallel with the major surface of the bottom conductor.

2. An electronic component according to claim 1, wherein an insulation film having a top surface that is substantially in plane with a top surface of the raised conductor is formed around the raised conductor.

3. An electronic component according to claim 2, wherein the dielectric film is formed on the insulation film.

4. An electronic component according to claim 1, wherein the second conductor entirely covers the raised conductor when viewed in a normal direction of the substrate.

5. An electronic component according to claim 1, wherein a thickness of the dielectric film is smaller than a thickness of the raised conductor.

6. An electronic component according to claim 2, wherein a thickness of the dielectric film is smaller than a thickness of the insulation film.

7. An electronic component according to claim 2, wherein a dielectric constant of the dielectric film is greater than a dielectric constant of the insulation film.

8. An electronic component according to claim 2, wherein the insulation film has a via opening.

9. An electronic component according to claim 1,
   wherein outer edges of the dielectric film overlap outer edges of the substrate.

10. An electronic component according to claim 1,
    wherein the coil conductor has a spiral shape when viewed in a normal direction of the substrate;
    the coil conductor is entirely formed on a same surface as a substrate surface where the bottom conductor is formed; and
    the another end of the coil conductor is in contact with an end of the lead-out conductor at the via opening.

11. An electronic component according to claim 10,
    wherein another end of the lead-out conductor extends to an outer edge of the substrate.

* * * * *